United States Patent
Derckx et al.

(10) Patent No.: US 12,322,203 B2
(45) Date of Patent: *Jun. 3, 2025

(54) BIOMETRIC SKIN CONTACT SENSOR AND METHODS OF OPERATING A BIOMETRIC SKIN CONTACT SENSOR

(71) Applicant: TOUCH BIOMETRIX LIMITED, St Asaph (GB)

(72) Inventors: Henricus Derckx, St Asaph (GB); Michael Cowin, St Asaph (GB); Wilhelmus Van Lier, St Asaph (GB); Toru Sakai, St Asaph (GB)

(73) Assignee: TOUCH BIOMETRIX LIMITED, St Asaph (GB)

( * ) Notice: Subject to any disclaimer, the term of this patent is extended or adjusted under 35 U.S.C. 154(b) by 121 days.

This patent is subject to a terminal disclaimer.

(21) Appl. No.: 18/024,861

(22) PCT Filed: Sep. 7, 2021

(86) PCT No.: PCT/GB2021/052299
§ 371 (c)(1),
(2) Date: Mar. 6, 2023

(87) PCT Pub. No.: WO2022/049399
PCT Pub. Date: Mar. 10, 2022

(65) Prior Publication Data
US 2023/0326230 A1 Oct. 12, 2023

(30) Foreign Application Priority Data

Sep. 7, 2020 (GB) ..................... 2014008
Sep. 29, 2020 (GB) ..................... 2015383

(51) Int. Cl.
*G06V 40/13* (2022.01)

(52) U.S. Cl.
CPC ................. *G06V 40/1306* (2022.01)

(58) Field of Classification Search
CPC .......... G06F 3/041661; G06F 3/03547; G06F 2203/04108; G06V 40/1359; G06V 40/1306; H03K 17/962
See application file for complete search history.

(56) References Cited

U.S. PATENT DOCUMENTS 5,101,206 A * 3/1992 Riedel .................... H03M 1/14
341/120
10,126,896 B2 11/2018 Solven et al.
(Continued)

FOREIGN PATENT DOCUMENTS

EP 1455264 9/2004
WO 03/094099 11/2003
(Continued)

OTHER PUBLICATIONS

Examination Report for GB2015383.9 (Mar. 16, 2021).
(Continued)

*Primary Examiner* — Mirza F Alam
(74) *Attorney, Agent, or Firm* — Barnes & Thornburg LLP

(57) ABSTRACT

A capacitive biometric skin contact sensor configured to resolve the contours of skin in contact with the sensor, wherein the sensor comprises: an array of sensor pixels, wherein each sensor pixel comprises a thin film transistor and a capacitive sensing electrode connected to the thin film transistor; a plurality of gate drive channels, wherein each gate drive channel is arranged to provide a gate drive signal to one or more of the sensor pixels; a plurality of read-out channels, wherein each read-out channel is arranged to receive a read-out current from one or more of the sensor pixels, each read-out current being indicative of a proximity to a respective capacitive sensing electrode of a conductive (Continued)

object to be sensed; and an analog to digital converter comprising a dual slope integrator arranged to receive, as its input, either an output current or a reference voltage, wherein said output current is based on one or more read-out currents; wherein the biometric sensor is configured to: apply the output current as the input to the dual slope integrator for a charging time period to charge a capacitor of the dual slope integrator; apply the reference voltage as the input to the dual slope integrator for a discharging time period, wherein the discharging time period comprises the amount of time it takes for the capacitor to discharge; and determine the proximity to the one or more respective capacitive sensing electrodes of the conductive body based on an indication of the discharging time period.

20 Claims, 6 Drawing Sheets

(56) References Cited

U.S. PATENT DOCUMENTS

| | | |
|---|---|---|
| 2004/0227743 A1 | 11/2004 | Brown |
| 2008/0303705 A1 | 12/2008 | Sakakibara |
| 2011/0186359 A1 | 8/2011 | Chen |
| 2012/0293444 A1 | 11/2012 | Wong et al. |
| 2013/0265279 A1 | 10/2013 | Park |
| 2014/0266262 A1 | 9/2014 | Taghibakhsh |
| 2015/0030217 A1* | 1/2015 | Wickboldt ............ G06F 3/0443 382/124 |
| 2015/0205405 A1* | 7/2015 | Yumoto ................ G06F 3/0446 345/174 |
| 2016/0148034 A1 | 5/2016 | Kremin et al. |
| 2017/0006245 A1 | 1/2017 | Akhavan et al. |
| 2017/0277931 A1 | 9/2017 | Uehara et al. |
| 2018/0089490 A1 | 3/2018 | Liang |
| 2019/0034688 A1 | 1/2019 | Lee et al. |
| 2020/0193128 A1* | 6/2020 | Son .................... G06V 40/1335 |

FOREIGN PATENT DOCUMENTS

| | | | |
|---|---|---|---|
| WO | WO-03094099 A1 * | 11/2003 | ........... G06K 9/0002 |
| WO | 2017/180819 | 10/2017 | |

OTHER PUBLICATIONS

Search Report & and Written Oginion for PCT/GB2021/052299 (Dec. 14, 2021).

Non-Final Office Action issued in U.S. Appl. No. 18/024,864 (Jan. 18, 2024).

\* cited by examiner

BIOMETRIC SKIN CONTACT SENSOR AND METHODS OF OPERATING A BIOMETRIC SKIN CONTACT SENSOR

This application is a US national stage application under Section 371 of PCT Application No. PCT/GB2021/052299, filed on Sep. 7, 2021, which claims priority from United Kingdom Application Numbers 2014008.3, filed Sep. 7, 2020, and 2015383.9, filed Sep. 29, 2020, the entirety of each are hereby fully incorporated by reference herein.

TECHNICAL FIELD

The present disclosure relates to the field of biometric skin contact sensors and methods of operating biometric skin contact sensors.

BACKGROUND

Secure, verifiable authentication, of user identity is an increasingly important part of all technology. To give just a few examples, it plays a part in:

User equipment (UE) for communication and consumer access to media content;
Computer devices and systems which store and provide access to sensitive data;
Devices and systems for financial transactions or access control to buildings; and
Access control for vehicles.

Biometric measurement of the user is now prevalent in all of these contexts and others. Biometric measures such as iris scanning, and facial recognition are dependent on lighting and field of view of a camera. It may also be possible to circumvent such security measures by presenting a video or photo of the user to the camera.

Fingerprint sensors have been thought of as being more secure, but it is possible also to overcome the security they provide, and the manufacturing requirements of such sensors makes it difficult to integrate them into other electronic devices such as mobile telephones and other UEs. In particular, fingerprint sensing demands very high resolution—at least hundreds of pixels per inch.

One example of such a sensor is Apple Inc's Touch ID®. This sensor is based on a laser-cut sapphire crystal. It uses a detection ring around the sensor to detect the presence of the user's finger. The Touch ID® sensor uses capacitive touch sensing to detect the fingerprint, and has a 500 pixel per inch (PPI) resolution.

Capacitance sensors such as these use capacitive effects associated with the surface contours of the fingerprint. The sensor array pixels each include an electrode which acts as one plate of a capacitor, the dermal layer (which is electrically conductive) acts as the other plate, and the non-conductive epidermal layer acts as a dielectric. The capacitance is greater where the dermis is closer to the pixel electrode, and so the surface contours of the skin can be sensed by measuring the capacitance of each pixel (e.g. based on the charge accumulated on the pixel electrode) and assembling an image from those pixels.

Both passive matrix and active matrix capacitive touch sensors have been proposed. Most so-called passive capacitive touch sensing systems use an external driving circuit (such as an integrated circuit, IC) to drive a matrix of passive electrodes, and a separate readout circuit (e.g. an IC) to readout charge stored on these electrodes during the drive cycle. The stored charge varies dependent on the tiny capacitance changes due to touch events. Passive electrode systems are sensitive to environmental noise and interference.

Active matrix capacitive touch sensors include a switching element in each pixel. The switching element may control a conduction path between the capacitive sensing electrode in the pixel, and an input channel to an analogue to digital converter (ADC) in a read-out circuit. Typically each column of pixels in an active array is connected to one such input channel. The charge stored in the array can thus be read from the active matrix by controlling the switching elements to connect each row of pixels, one-by-one, to the ADC.

Each pixel needs to be connected to the read-out circuit, and all of the pixels of each column are effectively connected in parallel. The parasitic capacitance associated with each pixel therefore combines additively. This places an inherent limit on the number of pixels that can be combined together in any one column. This in turn limits the size and/or resolution of a capacitive touch sensor.

There thus remains a significant unmet commercial need for large area high resolution touch sensors.

SUMMARY

Aspects of the disclosure are set out in the independent claims and optional features are set out in the dependent claims. Aspects of the disclosure may be provided in conjunction with each other, and features of one aspect may be applied to other aspects.

In an aspect, there is provided a capacitive biometric skin contact sensor configured to resolve the contours of skin in contact with the sensor. The sensor comprises: an array of sensor pixels, wherein each sensor pixel comprises a thin film transistor and a capacitive sensing electrode connected to the thin film transistor; a plurality of gate drive channels, wherein each gate drive channel is arranged to provide a gate drive signal to one or more of the sensor pixels; a plurality of read-out channels, wherein each read-out channel is arranged to receive a read-out current from one or more of the sensor pixels, each read-out current being indicative of a proximity to a respective capacitive sensing electrode of a conductive object to be sensed; a current multiplexer connected to a plurality of the read-out channels to receive read-out currents therefrom; and a current mirror assembly connected to the multiplexer to receive an input current therefrom and to provide a selected gain to the input current. The sensor is configured to control both: (i) the number of read-out currents selected by the multiplexer, and (ii) the selected gain to the input current.

Embodiments may enable the sensor to provide increased flexibility for controlling operational parameters of the sensor. In particular, embodiments may facilitate dynamic control of resolution and/or sensitivity for the sensor, as well as dynamic control of other parameters such as total measurement times and energy consumption for the sensor. For example, embodiments may enable control of resolution (e.g. by controlling the number of read-out currents selected by the multiplexer) and/or sensitivity (e.g. by controlling the selected gain to the input current). This may enable the sensor to be operated according to one or more different operational parameters by controlling operation of one or more components of the sensor. The sensor may be configured to control the selected gain based on (e.g. proportional to) the number of read-out currents selected by the multiplexer. For example, the sensor may be configured to control at least one of: (i) the selected gain, (ii) the number of currents selected by the multiplexer, and (iii) an amount of time for which gate-drive signals are applied to a pixel and/or the number of pixels to which gate drive signals are applied based on another one or more of these parameters. For example, this control of one or more parameters may be proportional to said one or more other parameters.

Controlling the number of read-out currents selected by the multiplexer may comprise at least one of: (i) selecting one of the read-out currents as an input current for the current mirror assembly, (ii) combining two or more of the read-out currents to provide an input current for the current mirror assembly, and (iii) multiplexing two or more of the read-out currents to provide a (time-ordered) sequence of input currents for the current mirror assembly (e.g. a first input current followed by a second input current). Multiplexing may comprise providing read-out currents, or combinations of read-out currents, as the input for the current mirror assembly in a time-ordered sequence (e.g. it may comprise time multiplexing, such as so that the input for the current mirror assembly is indicative of different read-out currents at different periods in time).

The sensor may be configured to control the selected gain based on at least one of: (i) the number of read-out currents selected by the multiplexer, and (ii) an amount of time for which the gate drive signal is applied to the one or more respective pixels. The sensor may be configured to increase the selected gain when the number of read-out currents selected decreases. For example, the sensor may be configured to increase the selected gain when the number of read-out currents combined to provide an input current for the current mirror assembly decreases. For example, the sensor may be configured to decrease the selected gain when the amount of time for which the gate drive signal is applied to the one or more respective pixels increases. For example, the sensor may be configured to control the selected gain so that, for each sensor pixel measurement, the total amount of charge brought about by that measurement (e.g. input current multiplied by amount of time) remains within a selected range. In other words, the sensor may be configured to operate the current mirror assembly to provide increased gain where the charge brought about by that measurement decreases (and vice-versa). The sensor may be operated to provide a selected gain which is based on properties of the sensor and/or pixels themselves. For example, the selected gain may be based on one or more of: the pixel size, properties of the capacitive sensing electrode, a duration of gate drive signals.

The sensor may be configured to control the number of read-out currents selected by the multiplexer based on at least one of: (i) the selected gain, and (ii) the amount of time for which the gate drive signal is applied to the one or more respective pixels. For example, the sensor may be configured to reduce the number of read-out currents which are combined when the selected gain is higher, and to increase the number of read-out currents which are combined when the selected gain is lower. The sensor may be configured to increase the number of combined read-out currents, or reduce the number of individually selected read-out currents when the amount of time decreases (and vice-versa).

The sensor may be configured to control both: (i) the number of read-out currents selected by the multiplexer, and (ii) the selected gain, to provide a selected level of resolution and/or sensitivity for the sensor. The sensor may be configured to decrease the number of different read-out currents combined by the multiplexer and/or to increase the selected gain to increase the resolution and/or sensitivity for the sensor. For example, the number of different read-out currents combined by the multiplexer (and also e.g. the number of individual read-out currents passed on as the input for the current mirror assembly) may be selected to provide a desired level of resolution, and/or the selected gain may be controlled to provide a desired level of sensitivity for each measurement.

The multiplexer may comprise a plurality of switches for controlling which of the read-out currents are selected. The sensor may be configured to select one or more values for the selected gain to the input current. The current mirror assembly may comprise a plurality of field effect transistors. The biometric sensor may be configured to control the selected gain to the input current by selecting which of the field effect transistors are used. The current mirror assembly may comprise: a first field effect transistor connected to the input current at both its gate region and its drain region; and a plurality of second field effect transistors each connected to the input current at their gate region and configured to output a scaled current at their source region. For example, the second field effect transistors may be configured to provide a gain of greater than one (e.g. to provide an amplified current) or to provide a gain of less than one (e.g. to provide a reduced current). The outputs from each of the second field effect transistors may be connected to provide an output current from the current mirror assembly. Each of the second field effect transistors may have at least one different property to provide different amounts of gain to the input current. The second field effect transistors may have different width to length ratios. The current mirror assembly may comprise a plurality of switches for controlling which of the second field effect transistors output an amplified current. The drain region of each of the second field effect transistors may be connected to a supply voltage via a respective switch. The biometric sensor may be configured to selectively open or close said switches to control which of the second field effect transistors output an amplified current.

The biometric sensor may comprise a plurality of multiplexers as disclosed herein. Each of the plurality of read-out channels may be coupled to a said multiplexer to provide their respective read-out current to said multiplexer. The multiplexer may be provided in an integrated circuit. The current mirror assembly may be provided in an integrated circuit. The multiplexer and the current mirror assembly may be provided in the same integrated circuit (e.g. they may be provided in a single integrated circuit). Alternatively, the multiplexer may be provided in the TFT array (e.g. the array of TFTs which provides the sensor array). For example, the multiplexer may be provided on the same substrate as the TFT array. The multiplexer may be provided on glass and/or foil (e.g. with the TFTs of the sensor array). The sensor may be configured to control which, and how many, of the read-out channels coupled to the multiplexer provide their respective read-out current to the multiplexer as its input at any given time. The current mirror assembly may be configured to provide amplification of the current input to the current mirror assembly from the current multiplexer to provide an output current. The sensor may be configured to control operation of the current mirror assembly to select an amount of amplification it provides to the multiplexer input. The biometric sensor may comprise an integrator configured to integrate the output current from the current assembly to provide an output voltage indicative of the proximity to the one or more respective capacitive sensing electrodes of the conductive object to be sensed. The output voltage (e.g. from the current mirror assembly) may be provided to an analog-to-digital converter to determine the proximity to one or more capacitive sensing electrodes of the conductive object to be sensed.

In an aspect, there is provided a method of operating a biometric sensor to resolve the contours of skin in contact with the sensor. The sensor comprises: an array of sensor pixels, wherein each sensor pixel comprises a thin film transistor and a capacitive sensing electrode connected to the thin film transistor; a plurality of gate drive channels, wherein each gate drive channel is arranged to provide a gate drive signal to one or more of the sensor pixels; a plurality of read-out channels, wherein each read-out channel is arranged to receive a read-out current from one or more of the sensor pixels, each read-out current being indicative of a proximity to a respective capacitive sensing electrode of a conductive object to be sensed; a current multiplexer connected to a plurality of the read-out channels to receive read-out currents therefrom; and a current mirror assembly connected to the multiplexer to receive an input current therefrom and to provide a selected gain to the input current. The method comprises: controlling both: (i) the number of read-out currents selected by the multiplexer, and (ii) the selected gain to the input current.

The method may comprise receiving a control signal indicating a desired level of resolution and/or sensitivity for the biometric sensor, and controlling both: (i) the number of read-out currents selected by the multiplexer, and (ii) the selected gain to the input current, to provide the desired level of resolution and/or sensitivity. The method may comprise increasing the resolution and/or sensitivity by decreasing the number of read-out currents selected and/or increasing the selected gain. The method may comprise controlling the selected gain based on at least one of: (i) the number of read-out currents selected by the multiplexer, and (ii) an amount of time for which the gate drive signal is applied to the one or more respective pixels. The method may comprise increasing the selected gain when the number of read-out currents selected decreases.

In an aspect, there is provided a capacitive biometric skin contact sensor configured to resolve the contours of skin in contact with the sensor. The sensor comprises: an array of sensor pixels, wherein each sensor pixel comprises a thin film transistor and a capacitive sensing electrode connected to the thin film transistor; a plurality of gate drive channels, wherein each gate drive channel is arranged to provide a gate drive signal to one or more of the sensor pixels; a plurality of read-out channels, wherein each read-out channel is arranged to receive a read-out current from one or more of the sensor pixels, each read-out current being indicative of a proximity to a respective capacitive sensing electrode of a conductive object to be sensed; and an analog to digital converter comprising a dual slope integrator arranged to receive, as its input, either an output current or a reference voltage, wherein said output current is based on one or more read-out currents. The biometric sensor is configured to: apply the output current as the input to the dual slope integrator for a charging time period to charge a capacitor of the dual slope integrator; apply the reference voltage as the input to the dual slope integrator for a discharging time period, wherein the discharging time period comprises the amount of time it takes for the capacitor to discharge; and determine the proximity to the one or more respective capacitive sensing electrodes of the conductive body based on an indication of the discharging time period.

Embodiments may enable the sensor to provide increased flexibility for controlling operational parameters of the sensor. In particular, embodiments may facilitate dynamic control of sensitivity for the sensor, as well as dynamic control of other parameters such as total measurement times and energy consumption for the sensor. For example, embodiments may enable control of sensitivity (e.g. by controlling the charging time period). This may enable the sensor to be operated according to one or more different operational parameters by controlling operation of one or more components of the sensor (e.g. the charging time period of the dual slope integrator). The sensor may be configured to control the charging time period based on (e.g. proportional to) an amount of time for which gate-drive signals are applied to a pixel and/or the number of pixels to which gate drive signals are applied. The dual slope integrator may be configured to switch between receiving the output current and receiving the reference voltage (e.g. to control whether the capacitor is charging or discharging).

The biometric sensor may be configured to control the charging time period. For example, the sensor may be configured to increase or decrease the charging time period. The biometric sensor may be configured to increase the charging time period to increase the sensitivity of the sensor (or vice-versa).

The sensor may comprise a current multiplexer connected to a plurality of the read-out channels to receive read-out currents therefrom. The biometric sensor may be configured to control the number of read-out currents selected by the multiplexer. The biometric sensor may be configured to: control the number of read-out currents selected by the multiplexer based on the charging time period; and/or control the charging time period based on the number of read-out currents selected by the multiplexer. The sensor may comprise a current mirror assembly configured to receive an input current indicative of the one or more read-out currents and to provide a selected gain to the input current to provide the output current. The sensor may be configured to control the selected gain to the input current. The biometric sensor may be configured to: control the selected gain to the input current based on the charging time period; and/or control the charging time period based on the selected gain to the input current.

The sensor may comprise: a current multiplexer connected to a plurality of the read-out channels to receive read-out currents therefrom; and a current mirror assembly connected to the multiplexer to receive an input current therefrom and to provide a selected gain to the input current to provide the output current. The sensor may be configured to control at least one of: (i) the number of read-out currents selected by the multiplexer, and (ii) the selected gain to the input current.

Embodiments may enable the sensor to provide increased flexibility for controlling operational parameters of the sensor. In particular, embodiments may facilitate dynamic control of resolution and/or sensitivity for the sensor, as well as dynamic control of other parameters such as total measurement times and energy consumption for the sensor. For example, embodiments may enable control of resolution (e.g. by controlling the number of read-out currents selected by the multiplexer) and/or sensitivity (e.g. by controlling the selected gain to the input current and/or by controlling the charging time period). This may enable the sensor to be operated according to one or more different operational parameters by controlling operation of one or more components of the sensor. The sensor may be configured to control the selected gain based on (e.g. proportional to) the number of read-out currents selected by the multiplexer. For example, the sensor may be configured to control at least one of: (i) the selected gain, (ii) the number of currents selected by the multiplexer, (iii) the charging time period, and (iv) an amount of time for which gate-drive signals are applied to a pixel and/or the number of pixels to which gate drive signals are applied based on another one or more of these parameters. For example, this control of one or more parameters may be proportional to said one or more other parameters.

The sensor may be configured to control at least one of: (i) the number of read-out currents selected by the multiplexer, and (ii) the selected gain to the input current, based on the charging time period. The sensor may be configured to control at least one of: (i) the number of read-out currents selected by the multiplexer, and (ii) the charging time period, based on the selected gain to the input current. The sensor may be configured to control at least one of: (i) the selected gain to the input current, and (ii) the charging time period, based on the number of read-out currents selected by the multiplexer. The sensor may be configured to control at least one of: (i) the number of read-out currents selected by the multiplexer, and (ii) the selected gain to the input current, to increase the output current when the charging time period is decreased. The sensor may be configured to select the resolution and/or sensitivity of the sensor by controlling at least one of: (i) the number of read-out currents selected by the multiplexer, (ii) the selected gain to the input current, and (iii) the charging time period.

The dual slope integrator may comprise an integrator and a comparator. For example, the integrator may comprise an operational amplifier integrator. The capacitor may be part of the integrator. The positive terminal of the comparator may be connected to a reference voltage such as ground. The negative terminal of the comparator may be connected to the output from the integrator. The output from the comparator may be connected to a controller configured to determine the discharging time period. The dual slope integrator may comprise a reset switch connected in parallel with the capacitor (e.g. the reset switch may be part of the integrator).

The dual slope integrator may be arranged to receive, as its input, either an output current or a reference voltage. The output current may be based on a read-out current from one or more of the read-out channels. Each read-out current may be indicative of a proximity to a respective capacitive sensing electrode of a conductive object to be sensed. The sensor may be configured to apply the output current as the input to the dual slope integrator for a charging time period before applying the reference voltage as the input to the dual slope integrator until the output from the dual slope integrator returns to zero (e.g. until a capacitor of the dual slope integrator discharges). The sensor may be configured to determine the proximity to the one or more respective capacitive sensing electrodes of the conductive body based on the length of time for which the reference voltage is applied to the dual slope integrator before the output from the dual slope integrator returns to zero (e.g. based on the discharging time period). The biometric sensor may comprise a controller configured to control the selective application of the output current or the reference voltage as the input to the dual slope integrator. The controller may be configured to determine the length of time for which the reference voltage is applied to the dual slope integrator before the output from the dual slope integrator returns to zero (e.g. the controller may be configured to measure the discharging time, such as to enable an indication of the output current to be determined therefrom).

The reference voltage input for the dual slope integrator may comprise both a lower reference voltage and a higher reference voltage. For example, the analog to digital converter may comprise a dual slope integrator arranged to receive, as its input, either an output current, a lower reference voltage or a higher reference voltage. The sensor may be configured to switch the input to the dual slope integrator between: (i) the output current, (ii) the lower reference voltage, and (iii) the higher reference voltage. The sensor may be configured to: use the lower reference voltage as the input to the dual slope integrator to provide a longer discharging time period for a given charging time period, and/or to use the higher reference voltage as the input to the dual slope integrator to provide a shorter discharging time period for a given charging time period. The sensor may be configured to select which of the reference voltages to use as the input to the dual slope integrator based on a desired operational parameter for the sensor. For example, the sensor may be configured to use the lower reference voltage as the input to provide a higher sensitivity measurement (e.g. to use the lower reference voltage as the input when operating in a higher sensitivity mode) and vice-versa. For example, the sensor may be configured to use the higher reference voltage as the input to provide a quicker discharging time period, and thus a quicker measurement time period. The sensor may be configured to use the higher reference voltage to provide a quicker measurement time and/or a higher resolution measurement (e.g. to enable more measurements to be obtained in a given time period). In an aspect, there is provided a method of operating a capacitive biometric skin contact sensor configured to resolve the contours of skin in contact with the sensor. The sensor comprises: an array of sensor pixels, wherein each sensor pixel comprises a thin film transistor and a capacitive sensing electrode connected to the thin film transistor; a plurality of gate drive channels, wherein each gate drive channel is arranged to provide a gate drive signal to one or more of the sensor pixels; a plurality of read-out channels, wherein each read-out channel is arranged to receive a read-out current from one or more of the sensor pixels, each read-out current being indicative of a proximity to a respective capacitive sensing electrode of a conductive object to be sensed; and an analog to digital converter comprising a dual slope integrator arranged to receive, as its input, either an output current or a reference voltage, wherein said output current is based on one or more read-out currents. The method comprises: applying the output current as the input to the dual slope integrator for a charging time period to charge a capacitor of the dual slope integrator; applying the reference voltage as the input to the dual slope integrator for a discharging time period, wherein the discharging time period comprises the amount of time it takes for the capacitor to discharge; and determining the proximity to the one or more respective capacitive sensing electrodes of the conductive body based on an indication of the discharging time period.

The method may comprise controlling the charging time period. The method may comprise increasing the charging time period to increase the sensitivity of the sensor. The biometric sensor may comprise a current multiplexer connected to a plurality of the read-out channels to receive read-out currents therefrom. The method may comprise: controlling the number of read-out currents selected by the multiplexer based on the charging time period; and/or controlling the charging time period based on the number of read-out currents selected by the multiplexer. The sensor may comprise a current mirror assembly configured to receive an input current indicative of the one or more read-out currents and to provide a selected gain to the input current to provide the output current. The method may comprise: controlling the selected gain to the input current based on the charging time period; and/or controlling the charging time period based on the selected gain to the input current.

The sensor may comprise: (i) a current multiplexer connected to a plurality of the read-out channels to receive read-out currents therefrom; and (ii) a current mirror assembly connected to the multiplexer to receive an input current therefrom and to provide a selected gain to the input current to provide the output current. The method may comprise: controlling the resolution, sensitivity and/or sensing time of the sensor by controlling at least one of: (i) the number of read-out currents selected by the multiplexer, (ii) the selected gain to the input current, and (iii) the charging time period. The method may comprise controlling at least one of: (i) the number of read-out currents selected by the multiplexer, and (ii) the selected gain to the input current, based on the charging time period. The method may comprise controlling at least one of: (i) the number of read-out currents selected by the multiplexer, and (ii) the selected gain to the input current, to increase the output current when the charging time period is decreased. The method may comprise controlling operation of at least one of: (i) the multiplexer, (ii) the current mirror assembly, and/or (iii) the dual slope integrator, based on an amount of time for which the gate drive signal is applied to each gate drive channel.

Embodiments of the present disclosure may comprise a sensor array comprising an array of sensor pixels. Each sensor pixel may comprise a reference capacitor, a thin film transistor and a capacitive sensing electrode. For each sensor pixel, the reference capacitor and the capacitive sensing electrode are connected to a gate region of the thin film transistor. For each sensor pixel: the reference capacitor may be connected in series with the capacitive sensing electrode so that, in response to a control voltage, an indicator voltage is provided at the connection between the reference capacitor and the capacitive sensing electrode to indicate a proximity to the capacitive sensing electrode of a conductive object to be sensed; and the thin film transistor may comprise a sense voltage-controlled impedance having a control terminal connected so that the impedance of the sense voltage-controlled impedance is controlled by the indicator voltage. Each sensor pixel may comprise a reset circuit for setting the control terminal of the sense voltage-controlled impedance to a reset voltage selected to tune the sensitivity of the pixels.

For example, aspects of the present disclosure provide a sensor array comprising a plurality of touch sensitive pixels, each pixel comprising: a capacitive sensing electrode for accumulating a charge in response to proximity of a conductive object to be sensed; a reference capacitor connected in series with the capacitive sensing electrode so that, in response to a control voltage, an indicator voltage is provided at the connection between the reference capacitor and the capacitive sensing electrode to indicate the proximity of the conductive object to be sensed. This arrangement may reduce or overcome the problem associated with parasitic capacitance which may occur in prior art touch sensors.

Each pixel may comprise a sense VCI (voltage controlled impedance) having a control terminal connected so that the impedance of the sense VCI is controlled by the indicator voltage. Typically the sense VCI comprises at least one TFT (thin film transistor) and the conduction path of the VCI comprises the channel of the TFT. A conduction path of the sense VCI may be connected to a first plate of the reference capacitor, and the control terminal of the first VCI is connected to the second plate of the reference capacitor. At least one plate of the reference capacitor may be provided by a metallisation layer of a thin film structure which provides the sense VCI.

The conduction path of the sense VCI may connect the first plate of the reference capacitor, and so also the control voltage, to an input of a readout circuit. This may enable the circuitry which provides the control voltage also to provide the basis for the output signal of the pixel. This may further address problems associated with parasitic capacitance and signal to noise ratio in prior art touch sensors. An alternative way to address this same problem is to arrange the conduction path of the sense VCI to connect a reference signal supply to an input of a readout circuit. The reference signal supply may comprise a constant voltage current source. Thus, modulating the impedance of the sense VCI of a pixel controls the current from that pixel to the input of the read-out circuit.

A select VCI may also be included in each pixel. This may be connected so that its conduction path is connected in series between the conduction path of the sense VCI and the reference signal supply. Thus, switching the select VCI into a non-conducting state can isolate the sense VCI from the reference signal input, whereas switching the select VCI into a conducting state can enable current to flow through the pixel (depending on the impedance of the sense VCI). A control terminal of the select VCI may be connected for receiving the control voltage, e.g. from a gate drive circuit.

Each pixel may comprise a gate line VCI, and a conduction path of the gate line VCI may connect the reference signal supply to the first plate of the reference capacitor for providing the control voltage.

Each pixel may comprise a reset circuit for setting the control terminal of the sense VCI to a selected reset voltage. The reset circuit may comprise a reset VCI. A conduction path of the reset VCI is connected between a second plate of the reference capacitor and one of (a) a reset voltage; and (b) a first plate of the reference capacitor. A control terminal of the reset VCI may be connected to another pixel of the sensor for receiving a reset signal (e.g. from a channel of a gate drive circuit which is connected to the control terminal of the select VCI of a pixel in another row of the array). The reset signal may be configured to switch the reset VCI into a conducting state, thereby to connect the second plate of the reference capacitor to the one of (a) the reset voltage and (b) the first plate of the capacitor. Connecting the second plate of the reference capacitor to the one of (a) the reset voltage.

In an aspect, there is provided a computer program product comprising computer program instructions configured to program a controller to perform any method disclosed herein.

FIGURES

Some examples of the present disclosure will now be described, by way of example only, with reference to the figures, in which.

Figure 4:
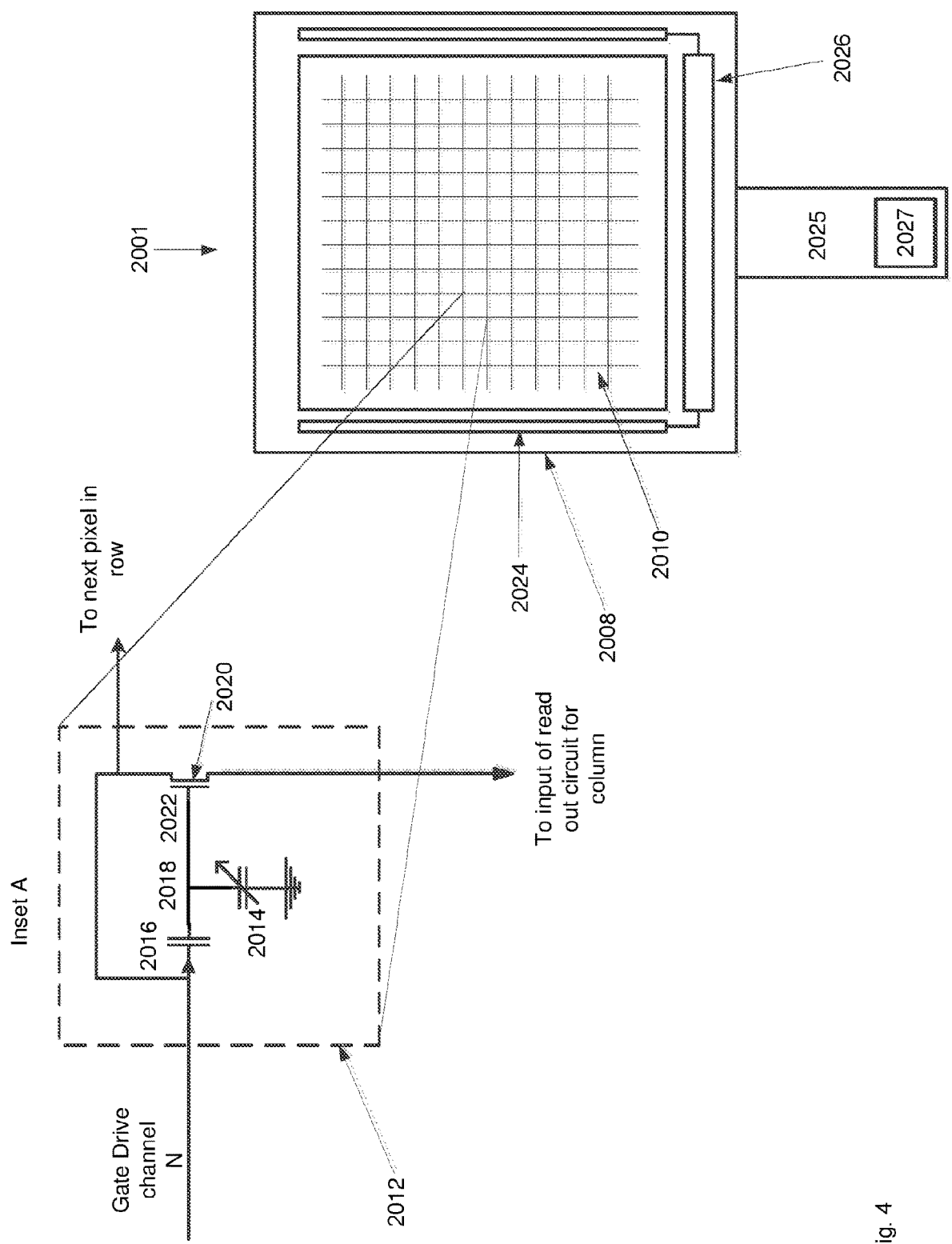

FIG. 4 comprises a plan view of a sensor apparatus comprising a sensor array, and Inset A of FIG. 4 shows a circuit diagram for a pixel of the sensor array.

Figure 5:
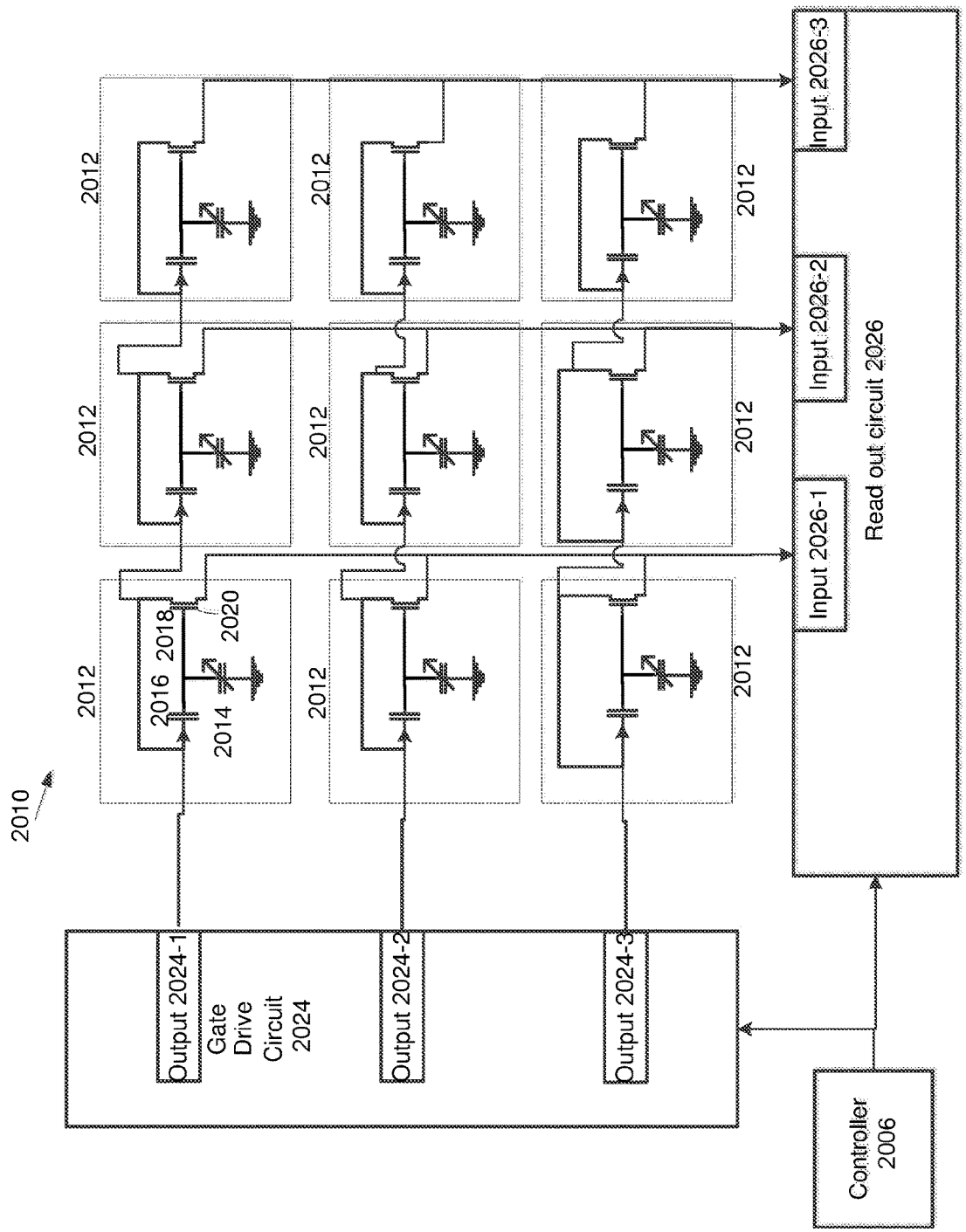

FIG. 5 shows a circuit diagram of a sensor array for a sensor apparatus such as that illustrated in FIG. 4.

Figure 6:
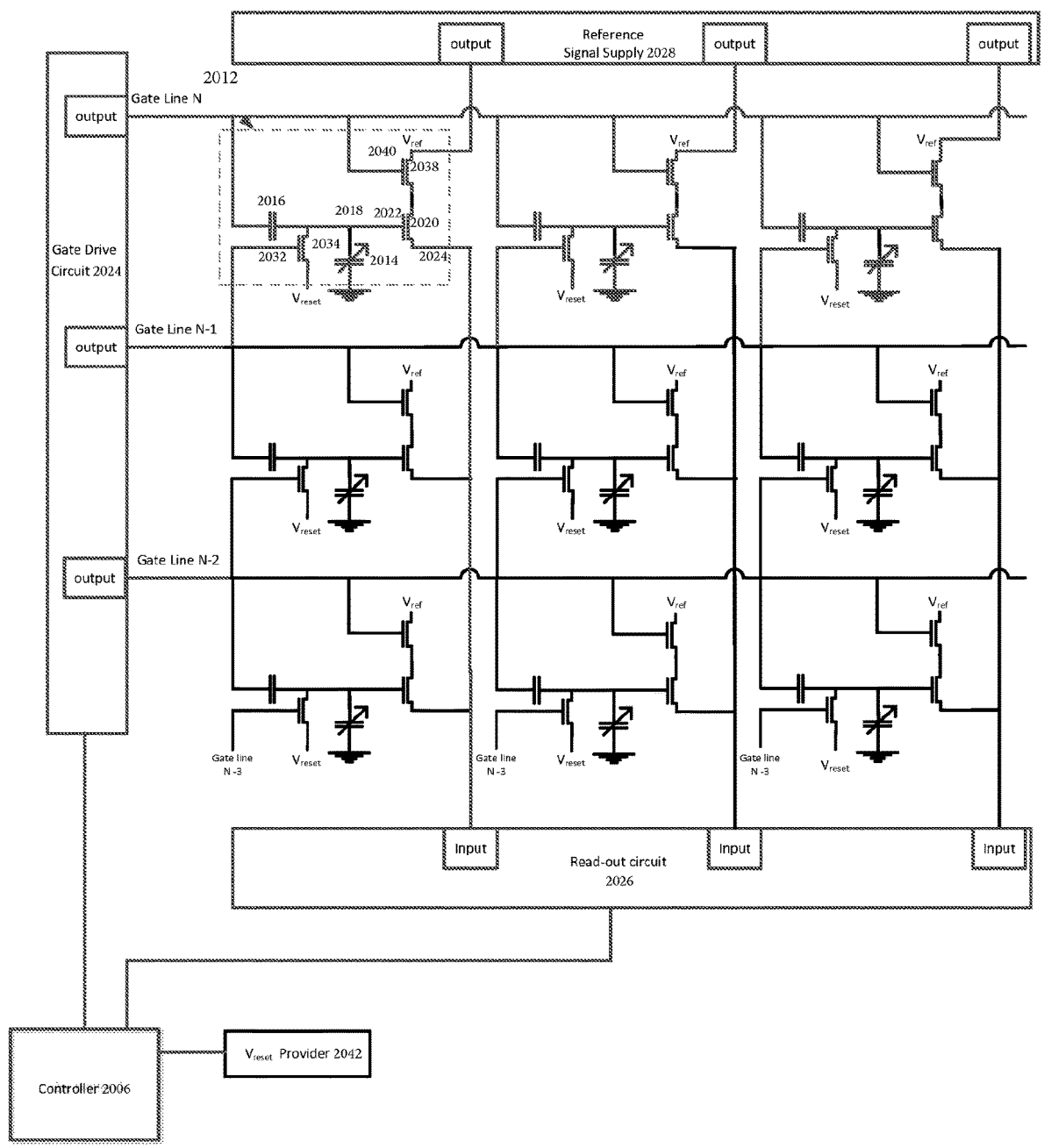

FIG. 6 shows a circuit diagram of another sensor array of the type shown in FIG. 4.

In the drawings like reference numerals are used to indicate like elements.

SPECIFIC DESCRIPTION

Embodiments of the present disclosure provide circuitry for processing read-out currents from sensor pixels of a capacitive biometric skin contact sensor. In embodiments, a current multiplexer may be provided to select which, and how many, read-out currents are to be measured at the same time. For example, in a high resolution mode, the current multiplexer may be configured to time-multiplex all of its read-out currents in order (e.g. one-by-one). In embodiments, a current mirror assembly may be provided to select an amount of gain to be provided to read-out currents to be measured. The current mirror assembly may comprise a current scaler (e.g. a current amplifier). The current mirror may be operable to provide scaled read-out currents to an analog to digital converter, such as a dual slope integrator analog to digital converter. In embodiments, such a dual slope integrator may be provided for measuring read-out currents, where a charging time of the dual slope integrator may be varied. One or more of these components (the current multiplexer, the current mirror and/or the dual slope integrator) of the circuitry for processing read-out currents may be controlled to provide a selected amount of resolution and/or sensitivity for the biometric skin contact sensor. For example, one or more of: (i) the number of read-out currents which are selected (by the current multiplexer), (ii) the selected gain (by the current mirror assembly), and (iii) the integration time (of the dual slope integrator), may be controlled to provide a selected amount of resolution and/or sensitivity for the biometric skin contact sensor. Sensors of the present disclosure may be configured to control two or more of these components of the circuitry, and the control of each component may be selected based also on control of the other component, e.g. so that the sensor as a whole provides desired characteristics for resolution and/or sensitivity.

One example of circuitry for processing read-out currents from sensor pixels of a capacitive biometric skin contact sensor will now be described with reference to FIG. 1.

Figure 1:
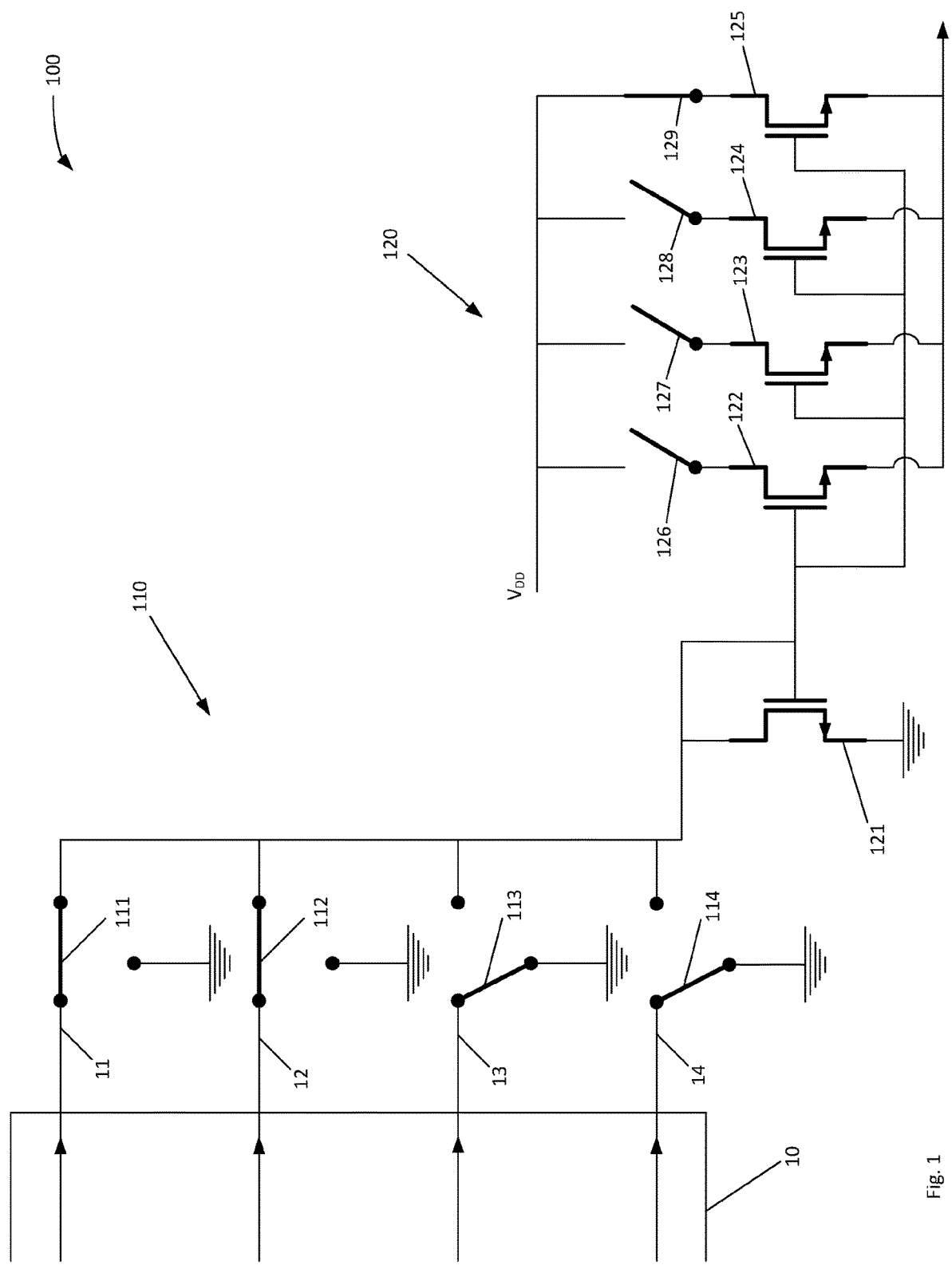
FIG. 1 shows a schematic diagram of exemplary processing circuitry including a current multiplexer and a current mirror assembly.

FIG. 1 shows processing circuitry 100. Processing circuitry 100 includes a current multiplexer 110 and a current mirror assembly 120. Also shown is a sensor array 10.

The current multiplexer 110 comprises a plurality of multiplexer switches 111, 112, 113 and 114. Each switch is connected to a respective one out of a plurality of read-out channels 11, 12, 13 and 14 from the sensor array 10. The current mirror assembly 120 comprises a first transistor 121 and a plurality of second transistors 122, 123, 124 and 125. Each of the second transistors is connected to a corresponding one of a plurality of current mirror switches 126, 127, 128 and 129. Each of the second transistors is connected to the first transistor 121 so that the gate-source voltage of that second transistor mirrors the gate-source voltage of the first transistor. The conduction path of each of the second transistors is connected in series with a corresponding one of a plurality of the plurality of current mirror switches. Each of the multiplexer switches is switchable between connecting its corresponding read-out channel to ground or connecting its corresponding read-out channel to the current mirror assembly input.

Each multiplexer switch is connected to a respective corresponding one of the plurality of read-out channels (e.g. a first multiplexer switch 111 is connected to a first read-out channel). Each of the multiplexer switches is also connected to a reference voltage (in the example shown, the reference voltage is ground). Each multiplexer switch is configured to switch between being connected to ground and to providing a connection between a read-out channel and the current mirror. A multiplexer output line is connected to each of the read-out channels downstream of the switch. The multiplexer output line is connected to the current mirror assembly 120 to provide an input current thereto. Each read-out current may pass through to ground (if the switch is closed) or pass through to the current multiplexer 110 (if the switch is open).

The multiplexer output line is connected to the current mirror assembly 120 to provide an input current to the current mirror assembly 120. In the example shown in FIG. 1, each transistor is an N Channel MOSFET. The multiplexer output line is connected to both the gate region and the drain region of the first transistor 121 (the drain of the first transistor 121 is shorted to its gate). The source region of the first transistor 121 is connected to ground. The gate region of the first transistor 121 and the multiplexer output line are also connected to the gate region of each of the second transistors. The second transistors have different width to length ratios. Each of the second transistors is connected at their respective drain regions to receive a supply voltage $V_{DD}$. The drain region of each second transistor is connected to its supply voltage $V_{DD}$ via a respective current mirror switch. The drain region of each second transistor will receive the supply voltage $V_{DD}$ if its respective switch is closed, and will not receive the supply voltage $V_{DD}$ if its respective switch is open. The source region of each second transistor is connected to a current mirror assembly output line. The current mirror assembly output line may be connected to downstream components for processing of current output from the plurality of second transistors.

The current multiplexer 110 is arranged to receive a plurality of read-out currents from the array of sensor pixels. Each read-out channel of the array 10 is arranged to receive a read-out current from one or more sensor pixels and to transmit said current to the multiplexer 110. For example, each read-out channel may be connected to a column of sensor pixels to receive one or more read-out currents therefrom. Each read-out channel has an associated multiplexer switch. The multiplexer 110 is connected to a plurality of read-out channels, wherein each of said read-out channels is connected to a respective switch of the multiplexer 110.

Each of the multiplexer switches is configured to selectively couple its respective read-out channel to ground or to the current mirror assembly 120. Each multiplexer switch may be configured to operate in a first mode in which a current from its read-out channel is directed to ground (the switch is closed), and in a second mode in which a current from its read-out channel is directed to the current mirror assembly 120 (the switch is open). Each of the read-out channels may receive read-out currents simultaneously, or at least within a very short time frame of one another. The multiplexer 110 is arranged to enable selection of the read-out currents. The multiplexer 110 is configured to control which, and how many, of the read-out currents should be passed to the current mirror assembly 120 at one time. That is, the multiplexer 110 is operable to selectively open or close the multiplexer switches to enable a number of selected read-out currents to be provided to the current mirror assembly 120. For example, the multiplexer 110 may simultaneously connect read-out currents to the current mirror assembly 120 to combine them (e.g. to provide read-out currents 1 to 4 to the current mirror assembly 120 at the same time). As another example, the multiplexer 110 may connect each individual read-out current to the current mirror assembly 120 sequentially in time (e.g. read-out current 1, then read-out current 2, then read-out current 3, then read-out current 4).

The multiplexer 110 is arranged to enable one read-out current to pass to the current mirror assembly 120 at a time. To do this, the multiplexer 110 is controlled so that all but one of the multiplexer switches are in their first mode. The read-out current associated with the multiplexer switch in its second mode will then pass to the current mirror assembly 120.

The multiplexer 110 is arranged to enable read-out currents from multiple read-out channels to be combined (e.g. addition of currents). To do this, the multiplexer 110 is controlled so that two or more multiplexer switches are in their second mode. The combined current will then be passed to the current mirror assembly 120.

The multiplexer 110 is arranged to enable read-out currents from multiple read-out channels to be multiplexed. To do this, the multiplexer 110 is controlled so that the switches are opened sequentially to provide multiplexing (time multiplexing). For example, the multiplexer 110 may be configured to enable one multiplexer switch to be in its second mode for a selected time period, while the remaining switches are in their first mode, then the multiplexer 110 is controlled so that a different multiplexer switch is the switch in its second mode (thereby to provide a time-multiplexed current to the current mirror assembly 120.

The multiplexer 110 is arranged to provide an input current to the current mirror assembly 120, wherein that input current is based on one or more read-out currents from read-out channels connected to the multiplexer 110. It will be appreciated that the input current provided may vary depending on operation of the multiplexer 110. Where the multiplexer 110 selects only one read-out current to be provided to the current mirror assembly 120 at any one time, the input current provided to the current mirror assembly 120 will correspond to that read-out current (e.g. it will be that read-out current). Where the multiplexer 110 combines two or more read-out currents, the input current provided to the current mirror assembly 120 will correspond to the combination of those read-out currents (e.g. it will be their sum). Where the multiplexer 110 multiplexes the read-out currents, the input current provided to the current will correspond to the individual read-out current, or combination of read-out currents as part of the multiplexed current at that time (e.g. it will be an individual read-out current when multiplexing one current at a time, or a combined read-out current when multiplexing multiple currents at a time).

The multiplexer 110 is therefore configured to control the input current provided to the current mirror assembly 120 by controlling operation of the switches (and thus controlling which of the read-out currents are selected). The current mirror assembly 120 is configured to receive, as its input, said current from the multiplexer 110.

Each of the second transistors of the current mirror assembly 120 is arranged to selectively receive a supply voltage $V_{DD}$ at its drain region. That is, each second transistor of the current mirror assembly 120 is connected to the supply voltage $V_{DD}$ by its respective current mirror switch. Each current mirror switch is configured to operate in a first mode in which no supply voltage $V_{DD}$ is supplied to its drain region and in a second mode in which the supply voltage $V_{DD}$ is supplied to its drain region. The gate region of each of the second transistors is connected to the input current from the current multiplexer 110 and the gate region of the first transistor 121. Each of the second transistors is arranged to output a current at their respective drain region based on the input to their gate and drain regions respectively. It will be appreciated that in the absence of any input current being provided to the current mirror assembly 120, or any supply voltage $V_{DD}$ being provided to the drain region of a transistor (e.g. because the respective switch is in its first mode), there will be no output from the source region.

The current mirror assembly 120 is configured to receive the input current and to provide an output current based on the input current. The current mirror assembly 120 is configured to provide a selected scaling to the input current. That is, the current mirror assembly 120 is configured to provide a selected amount of gain to the input current. The current mirror assembly 120 is configured to control the amount of gain by selecting which of the second transistors provide a current out of their source region. To do this, the current mirror assembly 120 is configured to control operation of each of the current mirror switches (whether each of the current mirror switches are open or closed). By controlling operation of the current mirror switches, the current mirror assembly 120 is thereby configured to control which of the second transistors receive an input at their respective drain regions and thus which provide an output at their respective source regions (assuming there is an input current provided to the current mirror assembly 120).

Each of the second transistors may be configured to provide a different output (at their source region). The second transistors are arranged to enable the current mirror assembly as a whole to provide a plurality of different amounts of gain to the input current. The second transistors are configured so that, in response to the same input being provided to each of the gate and drain regions, the output from the different transistors will be different. Each transistor is configured to provide a different amount of gain to the input current. In this example, to provide different amounts of gain, each transistor has a different width to length ratio. The different width to length ratios are selected to provide a numerical sequence for the gain ratios (e.g. a binary sequence such as 0.5, 1, 2, 4 may be used).

The current mirror assembly 120 is configured so that each of the second transistors will provide an output current in the event that its respective current mirror switch is in its second mode (closed) and an input current is provided to the current mirror assembly 120. The current mirror assembly output line is configured to receive the output current from each of the second transistors. The total output current from the current mirror assembly 120 will be the combination of the output currents from each of the individual second transistors. The current mirror assembly 120 is configured to provide a selected amount of gain to the input current by selecting which, and how many, of the second transistors are to provide an output current. For example, the current mirror assembly 120 may be configured to identify that the desired amount of gain corresponds to a combination of the second transistor, such as two, three or four of the second transistors (e.g. the desired amount of gain may correspond to the first and third of the second transistors 122, 124, and the switches for these transistors may be closed while the switches for the remaining second transistors are open).

In operation, the sensor array 10 is operated to provide one or more read-out currents through the read-out channels.

To do this, a gate drive signal is applied to one or more of the sensor pixels of the sensor array 10. Each of the sensor pixels comprises a capacitive sensing electrode and a thin film transistor connector the capacitive sensing electrode. In response to receiving a gate drive signal, each sensor pixel is configured to provide a read-out current which provides an indication of a proximity to said capacitive sensing electrode of a conductive object to be sensed. Said read-out currents are received by read-out channels which provide the read-out current to the current multiplexer 110. The sensor array 10 may be a rectangular grid of sensor pixels. A gate drive signal may be sequentially applied to each row in turn, with the gate drive signal being simultaneously applied to each pixel in a row. Each time a gate drive signal is applied, a read-out current may be obtained from all of the selected pixels in a column (e.g. this may be some, but not all of the pixels in a column, or all of the pixels in that column). These read-out currents are carried on read-out channels and provide the input to the current multiplexer 110.

Controlling operation of the processing circuitry 100 comprises controlling operation of the current multiplexer 110 and controlling operation of the current mirror assembly 120. Operation of the current mirror assembly 120 is controlled based on operation of the current multiplexer 110 (and vice-versa). Controlling operation of the multiplexer 110 comprises controlling which, and how many, of the current multiplexer switches are open at any one time. Controlling operation of the current mirror assembly 120 comprises controlling which, and how many, of the current mirror switches are open at any one time. Controlling operation of the current multiplexer 110 will influence the magnitude of the input current provided to the current mirror assembly 120, and what said input current represents. Controlling operation of the current mirror assembly 120 will influence the magnitude of the output current from the current mirror assembly 120, and how that output current corresponds to the input current.

Operation of the current multiplexer 110 and current mirror assembly 120 may be controlled to vary at least four operational parameters of the processing circuitry 100.

The first parameter is a resolution of the sensor array 10. The resolution of the sensor array 10 comprises a spatial resolution for operation of the sensor. This provides an indication of the smallest resolvable unit of the sensor array 10 (e.g. the spatial density of units from which sensor measurements have been obtained). The resolution of the sensor array 10 is linked to the density of sensor pixels in the sensor array 10. The maximum resolution will correspond to the density of sensor pixels in the sensor array 10. The resolution at any one time will also be based on the extent of current multiplexing, as this will influence the density of units from which sensor measurements are obtained.

The second parameter is a sensitivity for sensor measurements of the sensor array 10. Sensitivity of the sensor array 10 provides an indication of how much the sensor output changes in dependence on how much the sensor input changes. For example, the sensitivity of the sensor array 10 may provide an indication of how accurately the obtained measurement (sensed capacitance) corresponds to the true value for the measured property (capacitance). Increasing sensitivity of a sensor may comprise increasing the signal to noise ratio for obtained measurements.

The third parameter is a measurement time for sensor measurements of the sensor array 10. The measurement time provides an indication of the total amount of time it takes the sensor to obtain and process a measurement (e.g. to perform capacitive biometric skin-contact sensing using the sensor pixels of the sensor array 10). The measurement time is linked to the amount of time for which a gate drive signal is applied to each sensor pixel (e.g. to each row of sensor pixels). The measurement time will be based on the total amount of time taken to enable each sensor pixel array 10 to have had one gate drive signal applied thereto (or at least the total amount of time taken to enable each sensor pixel to which a gate drive signal is to be applied to have a gate drive signal applied thereto). For example, the minimum measurement time may be the total amount of time taken to enable each sensor pixel to which a gate drive signal is to be applied to have a gate drive signal applied thereto (but it may be more than this, such as to allow signal processing time and/or to allow gate-signals to be applied to some pixels more than once).

The fourth parameter is the amount of energy required to obtain a sensor measurement. That is, the amount of energy required to both obtain and process sensor measurements from each of the sensor pixels to which a gate drive signal is to be applied.

It will be appreciated in the context of the present disclosure that operation of the sensor array 10 will influence these four parameters. Likewise, operating the sensor to provide a selected value for one of the parameters will influence (e.g. place constraints on) the selected values for the other parameters. For example, to increase resolution, the multiplexer 110 may select each read-out current individually as the input current to the current mirror assembly 120. This will provide increased resolution but may also increase the measurement time and energy consumption (for constant sensitivity) or decrease the sensitivity (for constant measurement time and energy consumption).

Embodiments of the present disclosure provide processing circuitry 100 which enables these parameters to be varied. The circuitry 100 is configured to enable these parameters to be varied by controlling at least one of: (i) operation of the current multiplexer 110, (ii) operation of the current mirror assembly 120, and (iii) the amount of time for which each gate drive signal is applied to a sensor pixel. Operation of the sensor to control these properties will now be described.

In operation, the resolution of the sensor may be controlled by controlling operation of the multiplexer 110 and/or the number of gate drive signals applied to sensor pixels per each sensor cycle (one run through all the pixels from which measurements are to be obtained).

To increase the resolution of a sensor measurement, more individual read-out currents will have to be measured per sensor cycle. To do this, gate drive signals may be applied to more sensor pixels to ensure that there are more read-out currents for processing. For example, in a lower resolution mode, gate drive signals may be applied to some, but not all of the sensor pixels (e.g. some rows of sensor pixels may be skipped), and in a higher resolution mode, gate drive signals may be applied to more (e.g. all) of the sensor pixels (e.g. a gate drive signal may be applied to each row of sensor pixels, such as, a gate drive signal may be applied to each row in turn, e.g. applied row-by-row to one row at a time).

Where the number of gate drive signals applied to sensor pixels is held constant, the resolution of the sensor may be varied by controlling operation of the current multiplexer 110. To increase the resolution, the current multiplexer 110 may be operated so that each input current provided to the current mirror assembly 120 is representative of a smaller region of pixels. For example, where four read-out currents are combined into one input current for the current mirror assembly 120, this input current will correspond to a resolution which is less than that which would result if each read-out current was passed individually to the current mirror assembly 120. Therefore, to provide the highest resolution, the current multiplexer 110 may be operated to sequentially select each read-out current to be provided to the current mirror assembly 120 as the input current.

To do this, the multiplexer 110 is operated so that each multiplexer switch connects its read-out channel to the current mirror assembly 120 for a selected time period while the other three switches connect their read-out channel to ground. For example, one switch may be open (to connect its read-out channel to the current mirror assembly 120), and the other switches may be closed (to respectively connect their read-out channels to ground). As such, a first read-out current from the first read-out channel 11 is provided to the current mirror assembly 120 as the input current for the selected time period (e.g. multiplexer switch 111 is open, with multiplexer switches 112, 113 and 114 closed). Then, a second read-out current from the second read-out channel 12 is provided to the current mirror assembly 120 as the input current for the selected time period. Then, the same happens for a third read-out current, and then for a fourth read-out current. The signal provided to the current mirror assembly 120 over this entire time period may be considered to be a time-multiplexed signal where the input current provided to the current mirror assembly 120 for each selected time period represents a read-out current from a different one of the pixels.

In operation, the multiplexer 110 may be controlled according to a selected level of resolution. Operation of the switches of the multiplexer 110 may correspond to this selected level of resolution. A lowest resolution may be provided where only one input current is provided to the current mirror assembly 120 (e.g. either one individual read-out current or a combination of two or more read-out currents). A highest resolution may be provided where each individual read-out current is provided separately to the current mirror assembly 120 as the input current (in a time-sequential manner). Resolutions between the lowest and highest resolution may be provided where more than one different input current is provided to the current mirror assembly 120, but fewer input currents are provided than the total number that would be provided if one read-out current were provided as an input current for each of the read-out currents. For example, the sensor may operate in a plurality of different resolution modes. These resolution modes may include a lowest resolution mode, a highest resolution mode and one or more resolution modes corresponding to resolutions between the lowest and highest mode. The sensor may be configured to control operation in the different resolution modes so that more read-out currents are time-multiplexed in higher resolution modes, e.g. fewer read-out currents are combined in the higher resolution modes than in the lower resolution modes.

As one example of controlling the resolution, read-out currents may be received at each of the four read-out channels. The multiplexer 110 is operated to provide a medium level of resolution. To do this, the multiplexer 110 operates so that the first and second multiplexer switches 111, 112 are initially open, and the third and fourth multiplexer switches 113, 114 are shut (as shown in FIG. 1) so that a combination of current passing along the first and second read-out channels 11, 12 is provided as the input current to the current mirror assembly 120 and current passing along third and fourth read-out channels 13, 14 flows to ground. Thus, a first measurement is processed which corresponds to one measurement obtained from the two pixels which pro-vided a read-out current to the first and second read-out channels 11, 12. Then, the multiplexer switches are changed so that the first and second multiplexer switches 111, 112 are closed and the third and fourth multiplexer switches 113, 114 are opened. Then, a combination of current passing along the third and fourth read-out channels 13, 14 is provided as the input current to the current mirror assembly 120 and current passing along first and second read-out channels 11, 12 flows to ground. Thus, a second measurement is processed which corresponds to one measurement obtained from the two pixels which provided a read-out current to the third and fourth read-out channels 13, 14. This process is then repeated as read-out currents are received on the read-out channels which correspond to different sensor pixels in the array 10.

In operation, the sensitivity of the sensor may be controlled by controlling operation of the current multiplexer 110, the current mirror assembly 120 and/or the amount of time for which gate drive signals are applied to sensor pixels per each sensor cycle.

The length of time for which gate drive signals are applied to sensor pixels may be selected to provide the desired level of sensitivity (e.g. sensitivity may be increased by applying a gate drive signal to each sensor pixel for a longer period of time, and decreased by applying a gate drive signal for a shorter period of time). The length of time for which the multiplexer 110 passes one or more read-out currents as the input current to the current mirror assembly 120 may be controlled to vary sensitivity (e.g. if each input current to the current mirror assembly 120 is provided for a longer period of time the sensitivity may increase as compared to if it were provided for a shorter period of time). Measuring the signals downstream of the current mirror assembly 120 may comprise use of one or more integrator. It is to be appreciated in the context of the present disclosure that the signal to noise ratio of an integrated measurement may be improved with longer integration time. The number of read-out currents combined by the multiplexer 110 may also be controlled to provide a selected sensitivity.

Operation of the current mirror assembly 120 may be controlled to vary the sensitivity of measurements obtained by the sensor. To provide increased sensitivity for a given measurement, the current mirror assembly 120 may be operated to provide greater gain to the input current, and to provide less sensitivity for a given measurement, the current may be operated to provide less gain to the input current. Operation of the current mirror assembly 120 may be controlled to provide a selected amount of gain to the input current (e.g. based on a desired sensitivity level for the sensor).

For the current mirror assembly 120 to provide the maximum amount of gain to the input current, all of the second transistors will be operated to provide an output current. This will provide the greatest total output amount of gain. That is, this will provide the greatest output current for a given input current. The current mirror assembly 120 will be controlled so that each of the current mirror switches are closed (so that the supply voltage $V_{DD}$ is delivered to the drain region of each of the second transistors, and thus each of the second transistors may provide an output current from their source region).

For the current mirror assembly 120 to vary the amount of gain, the number of switches that are closed, and which of the switches it is that are closed is selected. For a given input current to the current mirror assembly 120, each of the second transistors will provide a different output current. Providing a selected gain to the input current by the current mirror assembly 120 comprises selecting the gain to be provided and identifying one second transistor, or a combination of second transistors, required to provide said gain. The current mirror switches are then controlled so that the selected one or more of the second transistors provide output current (e.g. have their respective current mirror switches closed) and the remaining second transistors to do not provide output current (e.g. have their respective current mirror switches open). The current output from the one second transistor with a closed switch, or the combination of currents output from the second transistors with closed switches, then provides the output current from the current mirror assembly 120 which will have the selected gain from the input current. In the example shown in FIG. 1, the fourth current mirror switch 129 is closed and the rest are open. The gain to the input current will be that provided by the fourth second transistor 125.

In operation, the measurement time of the sensor may be controlled by controlling the amount of time for which a gate drive signal is applied to each sensor pixel to which a gate drive signal is to be applied, and/or by controlling the amount of sensor pixels to which a gate drive signal is to be applied. For one sensor cycle, the measurement time will correspond to the amount of time it takes to apply the gate drive signal to each pixel (or row of pixels) in the array 10 to which a gate drive signal is to be applied. The sensor may therefore reduce the measurement time by reducing the amount of time for which each gate drive pulse is applied and/or by applying the gate drive signal to fewer sensor pixels. The sensor may control these factors to provide a desired measurement time.

In operation, the energy consumption of the sensor may be controlled by controlling operation of the current multiplexer 110, the current mirror assembly 120, and optionally the amount of time for which each gate drive signal is applied, and/or the amount of sensor pixels to which a gate drive signal is applied per each sensor cycle. To decrease the energy consumption of the sensor, the multiplexer 110 may be operated to take fewer measurements of different read-out currents. For example, the multiplexer may select only one read-out current to reduce energy consumption associated with generating and processing additional read-out currents. The sensor may also operate to combine a greater number of read-out currents to reduce energy consumption (for a fixed number of read-out currents available), thereby to provide an input current to the current mirror assembly 120 which has a greater magnitude. To decrease the energy consumption of the sensor, the current mirror assembly 120 may be operated to provide less gain. To decrease the energy consumption of the sensor, gate drive signals may be applied for less time, or gate drive signals may be applied to fewer sensor pixels. One or more of these parameters may be controlled to provide a selected amount of energy consumption for the sensor.

In addition to controlling operating of one component of the sensor to provide a selected value for the parameters described above, multiple components of the sensor may be controlled in combination. One component of the sensor may be controlled to compensate for undesirable effects on one or more of these parameters brought about by controlling operation of the sensor to improve another of these parameters.

Operation of the current mirror assembly 120 may be controlled to compensate for operation of the current multiplexer 110.

That is, the current multiplexer 110 is configured to control the number of the read-out currents to be selected. Where the current multiplexer 110 combines more read-out currents, the magnitude of the input current provided to the current mirror assembly 120 is likely to be greater (this will depend on the proximity to each respective capacitive sensing electrode of the sensor array 10 of a conductive body). As such, the current mirror assembly 120 may be operated to provide less gain to this input current. Where the current multiplexer 110 selects individual read-out currents as the input current to the current mirror assembly 120, the magnitude of this input current is likely to be less. As such, the current mirror assembly 120 may be operated to provide more gain to this input current.

The current mirror assembly 120 may be controlled to provide a selected amount of gain to the input current, where that selected gain is determined based on the number of read-out currents selected by the current multiplexer 110. The number and selection of current mirror switches which are closed may be selected based on the number of current multiplexer switches which are open.

In the event that the current multiplexer 110 is being operated in a manner expected to provide a greater input current to the current mirror assembly 120, the current mirror assembly 120 is operated to provide less gain to the input current. In the event that the current multiplexer 110 is being operated in a manner expected to provide a smaller input current to the current mirror assembly 120, the current mirror assembly 120 is operated to provide more gain to the input current. The current mirror assembly 120 may be operated to provide an amount of gain to the input current selected based on an expected value for the input current.

Operation of the current mirror assembly 120 may be controlled to control the measurement sensitivity for a given resolution, as provided by the operation of the current multiplexer 110. That is, where the current multiplexer 110 is being operated to obtain higher resolution measurements (e.g. where a greater number of different input currents are provided to the current mirror assembly 120 per unit time, and where these input currents are typically of smaller magnitude), then the current mirror assembly 120 is operated to provide a greater increase in sensitivity for these measurements (by providing greater gain). Likewise, where the current multiplexer 110 is being operated to obtain lower resolution measurements (e.g. where fewer different input currents are provided to the current mirror assembly 120 per unit time, and where these input currents are typically of greater magnitude, e.g. because two or more read-out currents have been combined to provide said input currents), then the current mirror assembly 120 is operated to provide less of an increase in sensitivity for these measurements (by providing less gain).

Operation of the current mirror assembly 120 may also be controlled based on the amount of time for which each gate drive signal is applied to a pixel. The current mirror assembly 120 may be controlled to provide increased gain to the input current when the amount of time for which each gate drive signal is applied to a pixel decreases. The current mirror assembly 120 may be configured to provide increased gain to the input current when the gate drive signal is applied to fewer pixels (e.g. this may be to compensate for the fact that the multiplexer 110 may then only be able to combine fewer read-out currents). For example, the current mirror assembly 120 may provide more gain to allow for reduced gate drive time and/or increased resolution.

In a similar manner, operation of the current multiplexer 110 may be controlled to compensate for operation of the current mirror assembly 120. That is, the current mirror assembly 120 may be configured to provide a certain amount of gain to the input current. Operation of the multiplexer 110 may be controlled so that the input current provided to the current mirror assembly 120 is of a suitable current for operation at the selected gain. For example, where the current mirror assembly 120 may be operating at a lower value for the selected gain, the multiplexer 110 may combine more read-out currents.

Operation of the current multiplexer 110 may be controlled based on the number of pixels to which gate drive signals are applied and/or the amount of time for which each gate drive signal is applied. The current multiplexer 110 may obtain an indication of which of its read-out channels should receive a read-out current from a sensor pixel. The current multiplexer 110 may be controlled based on this obtained indication, such as to prevent a read-out channel being selected (especially on its own) for which no read-out current is expected. The current multiplexer 110 may be controlled so that the fewer the amount of pixels from which a read-out current is received, the fewer different input currents the multiplexer 110 may provide to the current mirror assembly 120.

The current multiplexer 110 may be controlled so that the amount of time for which it selects read-out currents for the input current is controlled based on the amount of time for which a gate drive signal is applied to the pixels (e.g. to ensure that each read-out current is passed to the current mirror assembly 120 as, or as part of, the input current in that time period). The current multiplexer 110 may be configured to select the number of different input currents to be provided to the current mirror assembly 120 for one gate drive signal based on the amount of time for which the gate drive signal is applied. For example, the multiplexer 110 may be controlled so that the less the amount of time for which the gate drive signal is applied, the fewer different input currents the multiplexer 110 may provide to the current mirror assembly 120.

It will be appreciated in the context of the present disclosure that operation of the circuitry 100 shown in FIG. 1 enables increased freedom to select and implement different operational parameters for the sensor. That is, for a given set of gate drive parameters, the current multiplexer 110 may be operated to vary the resolution for the sensor. For a given resolution (as controlled at least in part by the current multiplexer 110), the current mirror assembly 120 may be operated to vary the sensitivity of the sensor. Depending on input parameters for the sensor, the current multiplexer 110 and current mirror assembly 120 may be controlled to provide a selected resolution and sensitivity for the sensor.

The output current from the current mirror assembly 120 may then be passed onto downstream circuitry of the sensor which is arranged to process said output current, and to determine therefrom, an indication of the proximity to each respective capacitive sensing electrode of a conductive object to be sensed. One example of components which may form part of said downstream circuitry will now be described with reference to FIG. 2.

Figure 2:
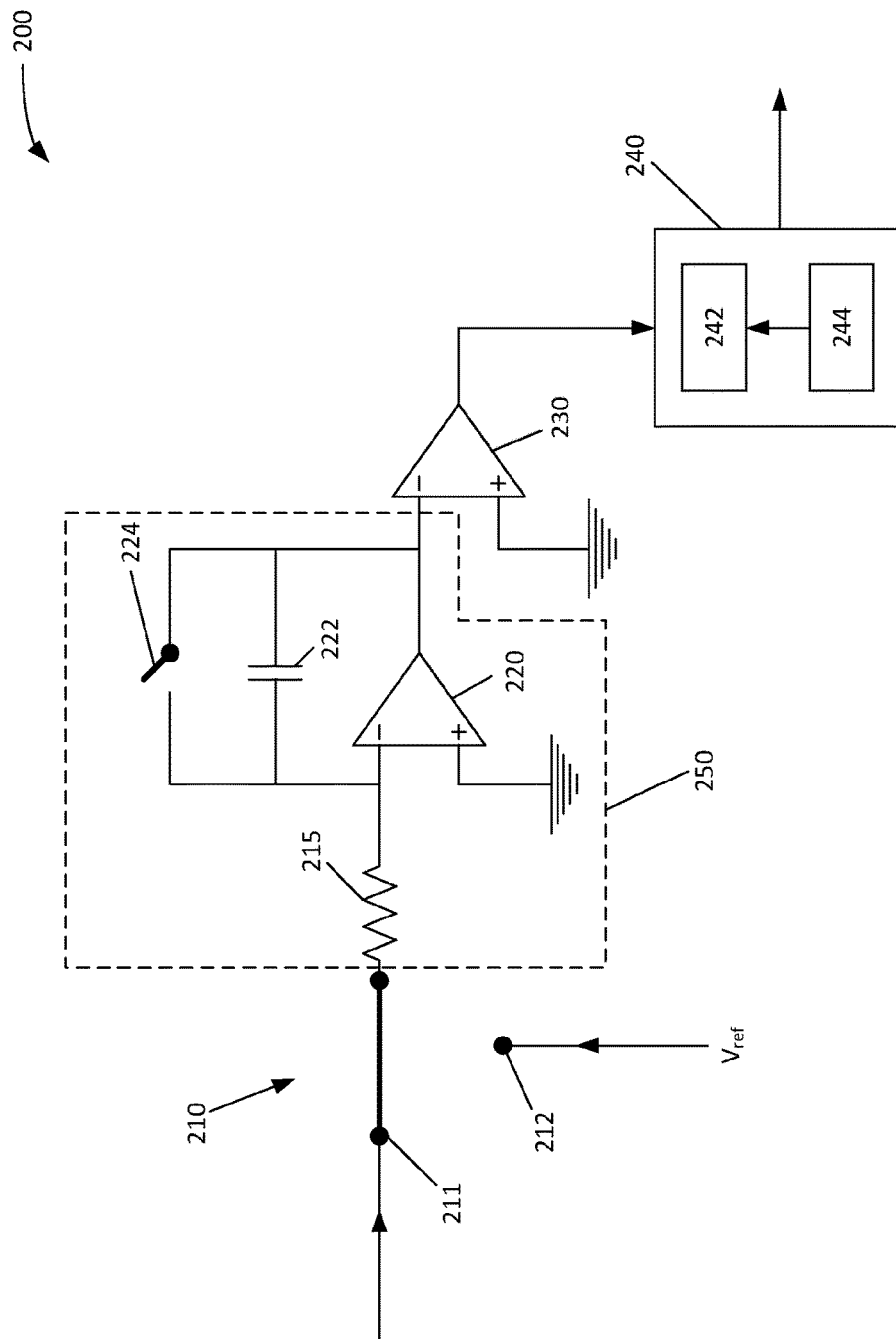
FIG. 2 shows a schematic diagram of an exemplary dual slope integrator.

FIG. 2 shows a dual slope integrator 200. The dual slope integrator 200 has an input 210 which includes a first input 211 and a second input 212. The dual slope integrator also includes an integrator 250. For example, the integrator 250 may comprise an operational amplifier integrator. The integrator 250 includes a resistor 215, an amplifier 220, and a capacitor 222. Optionally, as shown in FIG. 2, the integrator 250 includes a reset switch 224. The dual slope integrator 250 also includes a comparator 230. The dual slope integrator 200 also includes a control unit 240, which includes a processor 242, and a timing element 244.

The input 210 to the dual slope integrator 200 comprises a switch connection which is connectable to the first input 211 and the second input 212. The switch connection is arranged to switch between the first and second input so that it will be connected to either the first input 211 or the second input 212. The switch connection of the input 210 is connected to the resistor 215 of the integrator 250. The resistor 215 is connected to both the inverting input of the amplifier 220 and a first plate of the capacitor 220. The resistor 215 is also connected to the reset switch 224. The non-inverting input of the amplifier 220 is connected to a reference voltage, such as ground, as shown in FIG. 2. The capacitor 222 is connected between the inverting input of the amplifier 220 and the output terminal of the amplifier 220. The reset switch 224 is connected across the capacitor 224 (e.g. so that when closed, the switch shorts the plates of the capacitor 222).

The connection between the output terminal of the amplifier 220 and a second plate of the capacitor 222 is connected to the negative input to the comparator 230. The reset switch 224 is also connected to the connection between the output terminal of the amplifier 220 and the second plate of the capacitor 222. The positive input to the comparator 230 is connected to a reference voltage, such as ground (as shown in FIG. 2). The output from the comparator 230 is connected to the control unit 240. The timing element 244 is connected to the processor 242.

The input 210 to the dual slope integrator 200 is arranged to switch between the first input 211 and the second input 212. The first input 211 is arranged to receive a current indicative of one or more read-out currents. Each read-out current is indicative of a proximity to a respective capacitive sensing electrode of a conductive object to be sensed. The second input 212 is arranged to receive a reference voltage. The input 210 is thus arranged to switch between the current indicative of one or more read-out currents and the reference voltage. The input 210 is arranged to be connected to the first input 211 for a charging time period. That is, the input 210 is arranged to receive the current indicative of the one or more read-out currents for the charging time period. The input 210 is arranged to then switch to the second input 212 to receive the reference voltage. In this example, the reference voltage is negative (e.g. it has been inverted).

The dual slope integrator 200 is arranged so that the switch connection of the input either connects the first input 211 or the second input 212 to the inverting input of the amplifier 220 and the first plate of the capacitor 222 via the resistor 215 (e.g. the switch connection may switch between connecting the first input 211 to the integrator 250 and connecting the second input 212 to the integrator 250).

The integrator 250 is arranged so that, in the event that the switch connection of the input 210 is connected to the first input 211 (e.g. to receive the current indicative of one or more read-out currents), the capacitor 222 charges up. The sensor is configured to control the switch connection of the input 210 of the dual slope integrator 200 so that the capacitor 222 will be charged up for the charging time period (by the current indicative of the one or more read-out currents). The dual slope integrator 200 is arranged so that the amount of charge stored by the capacitor 222 is indicative of: (i) the current indicative of the one or more read-out currents, and (ii) the charging time period. Thus, the dual slope integrator 200 is arranged so that, when the charging time period is held constant for subsequent charges (e.g. for subsequent currents indicative of one or more read-out currents), the amount of charge stored by the capacitor 222 for each charge will be indicative of the value of that current indicative of the one or more read-out currents. The reset switch 224 is arranged to be open during charging of the capacitor 222 (e.g. it does not provide a conductive path for current to short the capacitor 222).

The integrator 250 is arranged so that, in the event that the switch connection of the input 210 is connected to the second input 212 (e.g. to receive the reference voltage), the capacitor 222 discharges. The sensor is configured to control the switch connection of the input 210 of the dual slope integrator 200 so that the input 210 will be connected to the second input 212 for enough time for the capacitor 222 to fully discharge. For example, the dual slope integrator 200 may be arranged so that the input 210 will remain connected to the second input 212 until a received indication that the capacitor 222 has discharged (e.g. as provided by the controller 240 monitoring the output of the comparator 230).

The comparator 230 is arranged to receive, as its negative input, the output from the integrator 250. The dual slope integrator 200 is arranged so that, in the event that the capacitor 222 stores some charge (e.g. it is not fully discharged), the comparator 230 will have a negative voltage at its negative input. The comparator 230 is connected to a reference voltage at its positive terminal, such as ground (as shown in FIG. 2). The comparator 230 is therefore arranged to provide a first output signal in the event that the capacitor 222 is at least partially charged, and a second output signal in the event that the capacitor 222 is fully discharged. The integrator 200 is arranged so that the output from the comparator 230 provides an indication of whether the capacitor 222 is charged or discharged. That is, once the charging time period has started and the discharging time period has yet to finish (and so there is at least some charge stored in the capacitor 222), the output of the comparator 230 will indicate the presence of a negative voltage at its negative input. Once a discharging time period is complete, and no charging time period has yet commenced (and so the capacitor 222 is discharged), such as after a measurement has been obtained, the output of the comparator 230 will indicate that there is no longer a negative voltage at its negative input (e.g. the voltage at its negative input is no longer below the voltage at its positive input, as they are both zero/grounded).

The control unit 240 is arranged to receive an indication of the output from the second comparator 230. The processor 242 is arranged to receive a clock signal from the timing element 244. The processor 242 is configured to determine an indication of the amount of time for which the capacitor 222 is discharging (e.g. to determine the discharging time period). That is, the processor 242 is configured to monitor the output from the comparator 230 and to measure the amount of time (using clock signals from the timing element 244) for which the output of the comparator 230 indicates the presence of charge on the capacitor 222. In this example, that amount of time corresponds to the amount of time for which the negative input to the comparator 230 has a negative voltage. Once the output from the comparator 230 has tripped (e.g. it switches to indicate that its negative input is no longer less than its positive input), the controller 240 is configured to obtain an indication of when the output tripped (from the timing element 244) and to determine a time period for the duration between the time when the output of the comparator 230 indicated the capacitor 222 started charging and the time when the output of the comparator 230 indicated the capacitor 222 had discharged. As the charging time period will be known, this combined charging and discharging time period will provide an indication of discharging time period.

The control unit 240 may be configured to start a timer when the input 210 is first connected to the first input 211 (and thus when the capacitor 222 starts charging). The control unit 240 is configured to run the timer until the output signal from the comparator 230 indicates that the capacitor 222 is discharged. The total time on the timer will include both the charging time period and a discharging time period (e.g. the charging time period may be subtracted from the total time period to provide the discharging time period). The discharging time period will be indicative of the amount of charge that was stored on the capacitor 222 in the selected time period, and thus indicative of the value for the current indicative of the one or more read-out currents.

The reset switch 224 is arranged so that, when open, it will short the capacitor 222. The dual slope integrator 200 may be arranged to close the switch 224 after each measurement (e.g. to short the capacitor 222 and thereby reset the dual slope integrator 200 for the subsequent measurement). For example, in the event that an indication that the measurement has been taken is received, the dual slope integrator 200 may be controlled to close the switch 224 and reset the dual slope integrator 200 for the next measurement (at which point the switch 224 will then be opened).

The dual slope integrator 200 is arranged so that, based on: (i) an obtained indication of the discharging time period for the capacitor 222, and (ii) the charging time period, the current indicative of the one or more read-out currents may be determined.

In operation, the timer is started, and the input 210 is connected to the first input 211 (with the reset switch 224 open). The input 210 remains connected to the first input 211 for the charging time period. During the charging time period, the first input 211 (e.g. from the current indicative of the one or more read-out currents) charges the capacitor 222. This brings about a negative voltage at the negative input to the comparator 230. This negative voltage increases in magnitude as more time passes with the first input connected to the integrator 250.

Then, after the charging time period has ended, the input 210 is switched so that it is connected to the second input 212 (e.g. the negative reference voltage). During this time period, the voltage at the negative terminal of the comparator 230 is increased (e.g. to begin with the magnitude of this voltage decreases as it returns towards zero from a negative value). The output from the comparator 230 is monitored by the control unit 240. The output from the comparator 230 will indicate whether or not the voltage at its positive input is greater than or equal to that at its negative input. As the voltage at the positive input is zero (ground), the output of the comparator 230 will change once the voltage at its negative input is no longer negative. Once the output from the comparator 230 changes (thus indicating that the capacitor 222 has fully discharged), the timer is stopped. The amount of charge that was stored by the capacitor 222 (and thus an indication of the current indicative of the one or more read-out currents) is determined based on the discharging time period (as determined based on the amount of time that passed before the output from the comparator 230 tripped). The discharging time period will be proportional to the amount of charge stored by the capacitor 222 (and thus the current output from the sensor pixel). For example, for a higher current output, the discharge time will be longer (e.g. increased as compared to a shorter charging time period or lower current output). The reset switch 224 is then closed to reset the dual slope integrator 200 for the next measurement.

The sensor is operable to vary the charging time period. That is, the sensor is configured to control the amount of time for which the input 210 is connected to the first input 211 and the capacitor 222 is charged by the current output from the sensor pixel. The sensor is configured to increase the charging time period to increase the sensitivity of the measurement. The system is configured to decrease the charging time period to provide quicker measurement times. The system thus enables a variable trade-off between the sensitivity of measurements and the amount of time taken for one measurement to be obtained. For example, operation of the dual slope integrator 200 (its charging time period) can be controlled to provide a selected level of sensitivity or measurement time.

It is to be appreciated in the context of the present disclosure that increasing the amount of charge provided to the capacitor of an integrator of an ADC of a sensor may provide an increased signal to noise ratio. Such increasing of the charge on the capacitor may be achieved by combining more read-out currents (by the current multiplexer 110), providing increased gain (by the current mirror assembly 120) and/or increasing the charging time period (of the dual slope integrator 200). Over a longer charging period, more variables which may influence the measurement value may have averaged out, such that fluctuations in the measurement may be smoothed. As one example, the timing element 244 may count in discrete time periods, and so any measurement of the discharge time may be accurate to within one of said time periods. By charging the capacitor 222 for longer, the discharge time will also be longer, but the time period of the timing element 244 will be the same. Thus, the accuracy limit brought about by one time period of the timing element 244 will be a smaller proportion of the total time measurement. As another example, to the extent that there may be any current or charge in the sensor which is undesirably applied to the capacitor 222 of the dual slope integrator 200 (e.g. a residual current/charge from a previous measurement or brought about by other components of the sensor), the contribution of this charge to the total charge on the capacitor 222 will be less if the charging time is increased, and thus the overall charge on the capacitor 222 is increased.

The sensor may be arranged to have a lower limit for the charging time. The lower limit may correspond to a minimum level of sensitivity. The lower limit may be selected based on an expected value (or values, such as a range from a minimum to a maximum expected value) for the current input to the dual slope integrator 200 from the sensor pixels. The sensor may be arranged to have an upper limit for the charging time. The upper limit may correspond to a maximum acceptable measurement time. The upper limit may correspond to a total capacity of the capacitor 222 (e.g. to reduce the likelihood that the charging time period will be long enough for the capacitor 222 to fully charge). The upper limit may be selected based on an expected value (or values, such as a range from a minimum to a maximum expected value) for the current input to the dual slope integrator 200 from the sensor pixels.

The sensor may be configured to select a value for charging time period depending on a desired level of sensitivity or measurement time for the sensor measurements. For example, the sensor may be configured to obtain an indication of a desired level of sensitivity or measurement time, and the sensor may control the charging time period accordingly. The sensor may have a plurality of set values for the charging time period, and controlling the sensor based on the obtained indication may comprise selecting one of the plurality of values for the charging time period. For example, the plurality of values may range from the lower limit to the upper limit. Alternatively, or additionally, the sensor may be configured to control the charging time period to any given time period (e.g. the charging time period may be a continuous variable which the sensor can control). The sensor may be configured to vary the charging time period for measurements from different pixels, or the charging time period may be the same for each pixel.

As one example of operation of the sensor, the senor obtains an indication of a desired level of sensitivity for the measurements indicative of a proximity to a respective capacitive sensing electrode of a conductive object to be sensed. The sensor selects a charging time period for the operation of the dual slope integrator 200 based on the obtained indication of the desired level of sensitivity. The higher the desired level of sensitivity, the longer the charging time period. The input 210 is thus connected to the first input 211 for the selected charging time period. Then, the input 210 is switched to the second input 212, and the discharging time measured. For subsequent measurements, the charging time period may remain as this selected charging time period, or it may be controlled to be a different charging time period (e.g. to provide greater or lower sensitivity for other measurements).

In the example described above with reference to FIG. 2, the reference voltages (for the amplifier 220 and the comparator 230) are shown to be ground. However, it will be appreciated in the context of the present disclosure that this should not be considered limiting. Other reference voltages may be provided. In the event that the reference voltage connected to the comparator 230 is not zero, it will be appreciated that the output from the comparator 230 may trip when the other input to the comparator 230 is at a different value (e.g. when the voltage at the negative input is no longer less than that at the positive input). It will also be appreciated that the circuitry may be inverted (e.g. so that the current indicative of the one or more read-out currents is negative). It will be appreciated that the output from the comparator 230 may trip when the voltage at its negative input is no longer wither greater than, or less than, the voltage at its positive input. The discharging time period will provide an indication of the magnitude of the charge that was stored on the capacitor. For example, where the charge on the capacitor is of greater magnitude, the magnitude of the difference in voltage between that at the negative input to the comparator 230 and the positive input to the comparator 230 will be greater, and vice versa. This greater difference in magnitude in the voltages at the positive and negative inputs of the comparator 230 will be evident in a greater discharging time period.

Figure 3:
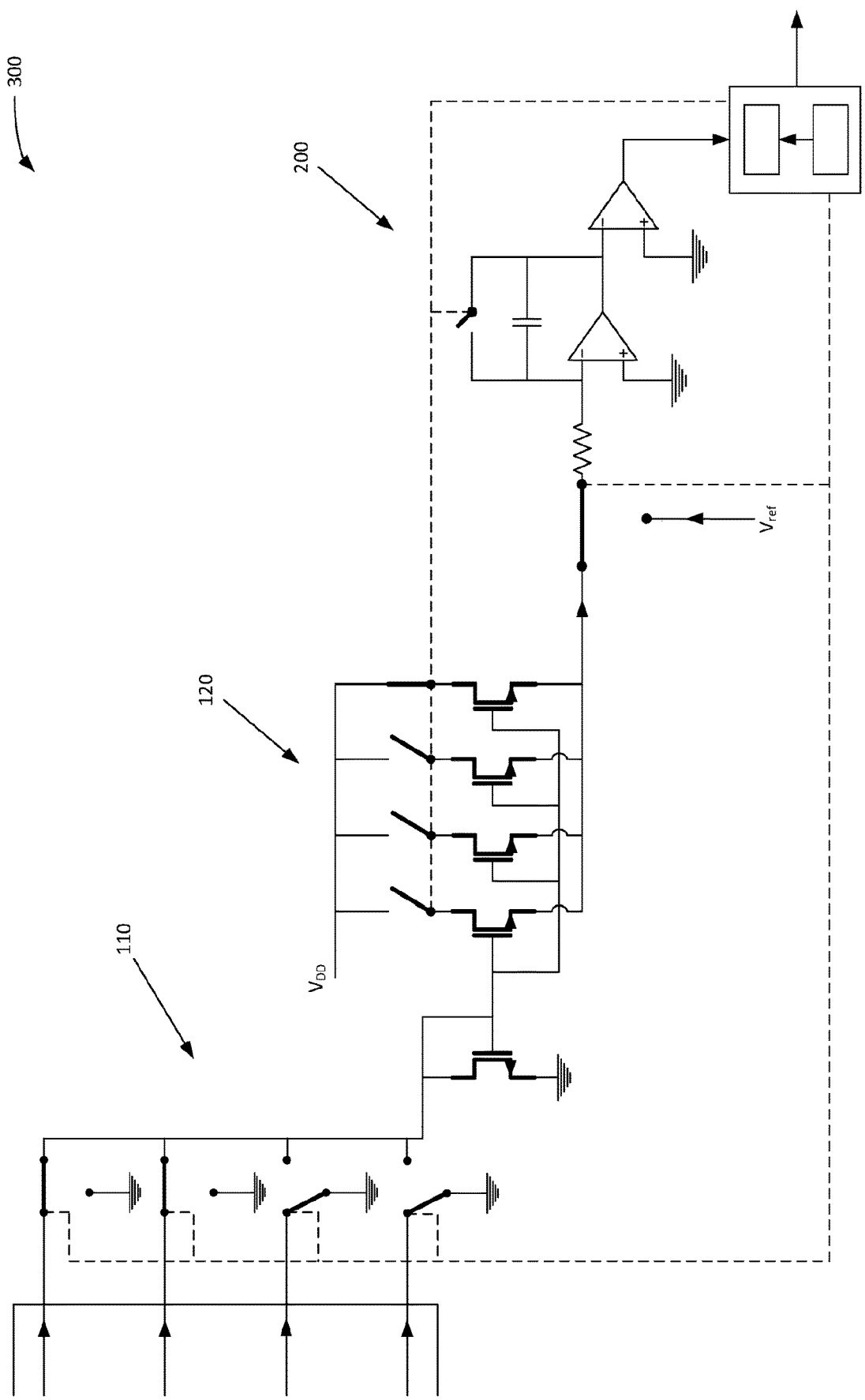
FIG. 3 shows a schematic diagram of a portion of exemplary read-out circuitry for a capacitive biometric skin contact sensor.

Processing circuitry described herein (e.g. the processing circuitry 100 described above with reference to FIG. 1) may be combined with Dual slope integrators described herein (e.g. the dual slope integrator 200 described above with reference to FIG. 2). FIG. 3 shows an example of such an arrangement.

FIG. 3 shows a portion of a sensor 300 which includes the processing circuitry 100 of FIG. 1 and the dual slope integrator 200 of FIG. 2 The portion of the sensor 300 shown in FIG. 3 corresponds to a portion of the read-out circuitry configured to process read-out currents to determine an indication of the proximity to the relevant capacitive sensing electrodes of the conductive body to be sensed. As shown, the processing circuitry 100 includes the current multiplexer 110 and the current mirror assembly 120. The output of the current mirror assembly 120 is connected to the dual slope integrator 200. The output from the current mirror assembly 120 is connected to the first input 211 of the input 210 of the dual slope integrator 200. That is, the sensor 300 is arranged so that the dual slope integrator 200 may selectively receive, at its first input 211, the output current from the current mirror assembly 120.

The control unit 240 is connected to each of the current multiplexer switches, the current mirror switches, and the dual slope integrator input 210. The control unit 240 may also be connected to reset switch 224 (if provided) for the dual slope integrator 200. These connections are shown in FIG. 3 as dashed lines. The control unit 240 is configured to control operation of each of these components. That is, for each of the current multiplexer switches and/or the current mirror switches, the control unit 240 is configured to control which of these switches are open or closed, and for how long these switches are open or closed. The control unit 240 is configured to control to which of the first or second input the input 210 of the dual slope integrator 200 is connected, and for how long this connection occurs. The control unit 240 may also be configured to control whether the reset switch 224 is open or closed, and for how long this occurs.

The current multiplexer 110, the current mirror assembly 120 and the dual slope integrator 200 provide three variables of the sensor 300 whose operation may be controlled by the control unit 240 to provide one or more desired properties for measurements obtained by the sensor 300. The control unit 240 may control one or more of: (i) the number of read-out currents selected by the current multiplexer 110 (as described above with reference to FIG. 1), (ii) the selected amount of gain provided by the current mirror assembly 120 (as described above with reference to FIG. 1), and (iii) the charging time period for the dual slope integrator 200 (as described above with reference to FIG. 2). It will be appreciated in the context of the present disclosure that these parameters may be controlled to vary the resolution, sensitivity and/or measurement time/energy consumption as described herein. It will further be appreciated that operation any one (or two) of these components may be controlled based on operation of the other one or more of these components. This functionality will now be described in more detail.

As described herein, controlling operation of the current multiplexer 110 to select individual read-out currents may enable higher resolution measurements to be obtained for the sensor 300. Controlling operation of the current multiplexer 110 to select individual read-out currents may provide a lower input current to the current mirror assembly 120 (as compared to the current multiplexer 110 combining multiple read-out currents). Controlling operation of the current mirror assembly 120 to provide increased gain to the input signal may enable higher sensitivity measurements to be obtained. Controlling operation of the current mirror assembly 120 to provide increased gain may also increase energy consumption for the sensor 300. Controlling operation of the dual slope integrator 200 so that the charging time period is longer may provide increased sensitivity for the sensor 300. Controlling operation of the sensor 300 so that the charging time period is longer may increase the total measurement time for the sensor 300 and/or the energy consumption of the sensor 300.

Examples of different ways to control these components of the sensor 300 (and their associated resulting parameters) will now be described.

Resolution of the sensor 300 may be selected by controlling operation of the current multiplexer 110. As disclosed herein, to increase resolution, the multiplexer 110 will combine fewer read-out currents, e.g. so that the total number of different input currents provided to the current mirror assembly 120 increases. That is, each input current provided to the current mirror assembly 120 will either be representative of a smaller region of the sensor array 10, or more input currents will be provided to the current mirror assembly 120 for the sensor array 10.

In the event that the current multiplexer 110 is operated to provide higher resolution, it may be expected that each individual input current to the current mirror assembly 120 will be of a lower magnitude than if more read-out currents had been combined to provide said input current. The sensor 300 may be configured to compensate for this drop in input current brought about by increasing the resolution. To do this, the sensor 300 may increase the amount of gain provided by the current mirror assembly 120 and/or increase the charging time period for the dual slope integrator 200.

The sensor 300 may be configured to control the increase in gain provided by the current mirror assembly 120 and/or the charging time period for the dual slope integrator 200 based on (e.g. proportional to) the change in resolution provided by the current multiplexer 110. For example, an expected change to the input current to current multiplexer 110 associated with the increase in resolution may be determined. The increase in gain provided by the current mirror assembly 120 may be selected to be proportional to, or as close as possible to proportional to, the expected drop in the input current brought about by the increase in resolution (e.g. the combination of second transistors used may be selected to provide a percentage increase in gain corresponding to the percentage decrease in input current associated with the increased resolution). The increase in charging time for the dual slope integrator 200 may be selected to be proportional to the expected drop in the input current to the current mirror assembly 120. For example, the charging time may be selected so that the charge accumulated on the capacitor 222 may be similar to that accumulated for the shorter charging time period and lower resolution.

The sensor 300 may be configured to vary both the charging time period and the selected gain to compensate for the decrease in input current brought about by the increased resolution. It is to be appreciated in the context of the present disclosure that any suitable combination of the two may be provided. For example, the selected gain or charging time may remain constant while the other variable is changed. As another example, both the selected gain and the charging time may change. The combination of changing both parameters may be selected to provide a desired overall increase in sensitivity and/or an overall performance efficiency e.g. a combination of one or more of sensitivity, resolution, measurement time and/or energy consumption.

The sensor 300 may be configured to determine how to control operation of the sensor 300 to provide the desired level of sensitivity based on one or more constraints associated with operation of the sensor 300. For example, the amount of time for which the gate drive signal is applied to each gate-drive channel and/or the amount of time for which a read-out current is obtained from each read-out channel may set an upper limit for the charging time period. Where read-out currents are multiplexed (e.g. time multiplexed), the amount of time for which each individual read-out current is provided as the input current to the current mirror assembly 120 may set an upper limit for the charging time period. As another example, there may only be a finite number of different possible values for gain provided by the current mirror assembly 120 (e.g. which correspond to different combinations of second transistors). Based on the intended resolution (e.g. based on an indication of the intended operation of the current multiplexer 110), the sensor 300 may determine a corresponding increase in gain and/or charging time period. This may be determined based on stored data (e.g. a mapping between multiplexer operation parameters and corresponding operation parameters for the current mirror assembly 120 and/or dual slope integrator 200), or this may be determined on-the-fly (e.g. based on an obtained measurement indicative of the input current provided to the current mirror assembly 120).

The sensor 300 may thus be configured to vary operation of the current mirror assembly 120 and/or the dual slope integrator 200 based on the resolution of the sensor 300. In particular, measurement sensitivity may be maintained by increasing the gain and/or the charging time period when the resolution increases (and vice-versa).

Also, the sensor 300 may be configured to vary measurement sensitivity independently of any changes in resolution. That is, the sensitivity of the sensor 300 may be increased or decreased for a constant or varying resolution by controlling the current mirror assembly 120 and/or dual slope integrator 200 accordingly. In a manner similar to the example described above, sensitivity may be increased by increasing the charging time period and/or by providing more gain (and vice-versa). The sensor 300 may obtain an indication of a desired level of sensitivity, and the sensor 300 may be configured to control operation of the current mirror assembly 120 and the dual slope integrator 200 to provide said desired level of sensitivity.

Operation of the sensor 300 (the current multiplexer 110, the current mirror assembly 120 and/or the dual slope integrator 200) may be controlled based on one or more alternative desired parameters for the sensor 300. The alternative desired parameters may comprise at least one of: (i) a time for one sensor cycle (the total time taken to obtain a sensor measurement from each of the pixels for which a measurement is to be obtained), and (ii) an amount of energy consumption per sensor measurement (either per pixel or per sensor cycle). The sensor 300 may be configured to control operation of the sensor 300 based on these alternative desired parameters by controlling the sensor 300 to compromise (or compensate for) on one or more of sensitivity and resolution for the sensor 300. It will be appreciated that the highest resolution, highest sensitivity measurements will likely take longer and be more energy consuming than lower resolution/sensitivity measurements.

To reduce the energy consumption, the sensor 300 may be configured to: (i) take fewer measurements (e.g. more read-out currents may be combined), (ii) provide less gain, and/or (iii) use a lower charging time period. For example, to keep energy consumption under a threshold amount, the gain may be controlled to be at or below a threshold value. To compensate for reduced gain, and/or to reduce the number of measurements which are needed (and total measurement time), the sensor 300 may operate the current multiplexer 110 to combine more read-out currents. That way, the input current to the current mirror assembly 120 will be higher (and so the output from the current mirror assembly 120 may remain at a similar value to the output current had there been more gain and a lower input current). By combining read-out currents (and providing fewer individual or multiplexed read-out currents to the current mirror assembly 120), the energy consumption for the sensor 300 may be reduced (in so doing, resolution may also decrease). Alternatively, or in addition, the charging time period may be reduced. This may reduce the amount of active time for the sensor 300 per sensor cycle, thereby reducing the energy consumption per sensor cycle.

To reduce the total measurement time, the number of measurements taken per sensor cycle may be decreased. To do this, the amount of gate drive signals applied to gate drive channels and/or the amount of time for which each gate drive signal is applied may be reduced. The current multiplexer 110 may be configured to combine more read-out currents, and/or to skip read-out currents associated with pixels to which no gate drive signal is applied. The current mirror assembly 120 may be configured to provide increased gain to the input current it receives from the current multiplexer 110. It will be appreciated that the maximum charging time for the dual slope integrator 200 may decrease when the amount of time for which each gate drive signal is applied decreases. The current multiplexer 110 may therefore combine more read-out currents, and/or the current mirror assembly 120 may provide more gain to allow for the charging time decreasing.

The sensor 300 may therefore reduce the total energy consumption or measurement time while providing a maintained (or at least less reduced) sensitivity or resolution for sensor measurements. This trade-off may be controlled by controlling operation of the current multiplexer 110, current mirror assembly 120 and/or dual slope integrator 200 accordingly.

Thus, the sensor 300 provides components which enable their respective parameters to be adapted so as to provide desired operational parameters for the sensor 300. That is, the current multiplexer 110, current mirror assembly 120 and/or dual slope integrator 200 may be operated accordingly to vary the sensitivity, resolution, measurement timings and energy consumption for the system. Each of these components may enable some flexibility for controlling operational parameters of the sensor 300. In addition to each of these individual components enabling this flexibility in operational parameters of the sensor 300, these components may also operate together to provide even greater flexibility. For example, one or more components may be controlled to compensate for an operational parameter brought about by operating another one of the components in a particular way. These components may also enable one or more operational parameters of the sensor 300 to be fixed to a desired level, with another operational parameter then controlled (e.g. maximised) according to the fixed parameter. For example, for a given limit on energy consumption or measurement time, the sensor 300 may be configured to compensate to provide the highest resolution or sensitivity possible for the given limit.

It is to be appreciated in the context of the present disclosure that the examples described above are exemplary but not limiting on the scope of the claims. Instead, the above description provides examples of how the technology may be implemented. However, this technology may be implemented in alternative or additional ways. Also, features described above should not be considered as essential unless explicitly stated so, as these features may either not be provided, or alternative features may be provided instead.

For example, it is to be appreciated that the exact arrangement of switches shown in the Figs. is not to be considered limiting. Instead, the arrangement shown is intended to illustrate the functionality of switching. For example, the switches of the current mirror assembly 120 may instead selectively connect the input current to the gate region of the second transistors (rather than selectively connecting the transistors to the supply voltage $V_{DD}$). As another example, where ground voltages are shown in the Figs., these could instead be provided by a reference voltage that is not grounded. For instance, the first transistor 121 may be connected to a reference voltage, and the negative input to the comparator and/or the non-inverting input to the operational amplifier 220 may also be connected to the same reference voltage (or a different reference voltage). The switches of the current multiplexer 110 could also be connected to such a reference voltage, or another reference voltage.

In the examples described above, the current mirror assembly 120 may be arranged to provide one of a plurality of different selected values for gain. For this, the second transistors are described as having different values for their width to length ratios. However, it is to be appreciated in the context of the present disclosure that this is not limiting. For example, each second transistor could have the same width to length ratio, and different values for gain could be provided by selectively combining their respective output currents. Alternatively, or additionally, a different property of these second transistors could be varied, such as the property of the material of the transistor itself. As another example, one or more resistors may be provided to enable each second transistor to provide a different output (e.g. one or more current limiting resistors may separate the supply voltage $V_{DD}$ from the second transistors/the second transistors from the current mirror assembly output current, or one or more resistors may be located between the current input and the gate region of some or all of the second transistors).

In the examples described above, the current multiplexer 110 and the current mirror assembly 120 may be provided in one integrated circuit. That is, the current multiplexer 110 and the current mirror assembly 120 may be part of the same integrated circuit. However, this need not be the case. The current multiplexer 110 and the current mirror assembly 120 may be provided by separate integrated circuits. The current multiplexer 110 may be implemented as part of the sensor array (e.g. as part of the TFT array for sensor pixels). This array (and current mirror assembly 120) may be provided on a suitable substrate, such as glass or a flex substrate or foil.

In examples described herein, a dual slope integrator 200 may be provided. The dual slope integrator 200 is arranged to receive the output current from the current mirror assembly 120, and to form part of the analogue to digital conversion circuitry which enables a digital measurement to be obtained from the sensor array 10. However, it is to be appreciated that the output from a current multiplexer 110 and/or current mirror assembly 120 need not be provided to a dual slope integrator 200. For example, the output from the current mirror assembly 120 (or current multiplexer 110 in examples without a current mirror assembly 120) may be connected directly, or indirectly, to alternative circuitry for analogue to digital conversion. Such circuitry may include alternative components such as an op amp integrator in combination with a sample and hold circuit. In examples which include a dual slope integrator 200, it will be appreciated that the current output from the current mirror assembly 120 (or the current multiplexer 110 in examples without a current mirror assembly 120) may be connected directly or indirectly (e.g. via additional components) to the input 210 to the dual slope integrator 200.

It is to be appreciated in the context of the present disclosure that each read-out current may be received at the read-out channel for an amount of time corresponding to the amount of time for which a gate drive signal is applied to the sensor pixel (and the amount of time for which read-out circuitry is operated to obtain a read-out current from that read-out channel). Operation of the multiplexer 110 may be controlled so that any changes to the multiplexer switches occur during this time period (e.g. so that if a read-out current from each individual read-out channel is wanted, they are all measured during this time period). For example, the sensor 300 may be controlled so that when more read-out currents are to be measured individually, the gate drive signals are applied to the sensor pixels for a longer period of time. The current multiplexer 110 may be operated so that each individual read-out current is fed to the current mirror assembly 120 for the same amount of time, or different timings may be used (e.g. to give more time to a more important pixel).

In the examples described herein, a reset switch 224 is provided to the dual slope integrator 200, but it will be appreciated that the dual slope integrator 200 may function without said reset switch 224. A given measurement may be obtained from the sensor 300 without the need for a reset, and/or alternative circuitry may be provided which enables resetting of the dual slope integrator 200.

In examples described herein the input 210 to the dual slope integrator 200 is connected to a first input 211 or a second input 212, where the first input 211 is indicative of one or more read-out currents and the second input 212 is a reference voltage. However, the input to the dual slope integrator 200 may have additional inputs. For example, the arrangement may be inverted to enable the inputs to be provided to the alternate terminal of the comparator. As another example, additional inputs may be provided. For example, a third input may be provided which provides a different value for the reference voltage. It is to be appreciated in the context of the present disclosure that the sensor 300 may be configured to switch between the second and third input to provide a selected reference voltage as the input (and thus provided a selected discharging rate for the dual slope integrator 200). The sensor 300 may be configured to select between the second and third input to provide desired discharge speeds (e.g. to control operational parameters such as sensitivity, total measurement time and energy consumption).

It is to be appreciated in the context of the present disclosure that the sensor 300 may be configured to control timing of gate drive signals. For example, although not shown in FIG. 3, the control unit 240 may be connected to the gate drive circuit to control application of gate drive signals therefrom. The gate drive signals may be controlled based on operational parameters of the sensor 300 such as the intended application of the current multiplexer 110 (e.g. how many read-out currents are to be selected), the current mirror assembly 120 (e.g. how much gain is to be applied) and/or the dual slope integrator 200 (e.g. the discharge time period). For example, longer gate drive signals may be applied to each pixel where greater resolution and/or sensitivity is wanted (e.g. to enable more read-out currents to be multiplexed for greater resolution and/or to enable a longer charging time period for greater sensitivity). Alternatively, operation of the components of the sensor 300 may be controlled based on selected conditions for the gate drive signals. For example, the charging time period may be selected to be less than or equal to the gate drive signal application time, and/or the number of read-out currents to be multiplexed and/or the amount of gain provided by the current mirror assembly 120 may be controlled based on the available time for read-out currents to be passed as input currents to the current mirror assembly 120.

In examples described herein, sensors may comprise a sensor array 10 including a plurality of sensor pixels, wherein each sensor pixel is configured to provide an indication of the proximity to that sensor pixel of a conductive object to be sensed. With reference to FIGS. 4 to 6, some exemplary arrangements for such sensor arrays and sensor pixel designs will now be described.

FIG. 4 shows a sensor apparatus 2001 including a sensor array 2010 which may provide sensor arrays of the present disclosure disclosed herein. FIG. 5 illustrates a circuit diagram of one such sensor array 2010. The description which follows shall refer to FIG. 4 and FIG. 5 together. It can be seen from an inspection of FIGS. 4 and 5 that inset A of FIG. 4 shows a detailed view of one pixel of this array 2010.

The sensor array 2010 comprises a plurality of touch sensitive pixels 2012. Typically, other than in respect of its position in the array, each pixel 2012 is identical to the others in the array 2010. As illustrated, each pixel 2012 comprises a capacitive sensing electrode 2014 for accumulating a charge in response to proximity of the surface of a conductive object to be sensed. A reference capacitor 2016 is connected between the capacitive sensing electrode 2014 and a connection to a gate drive channel 2024-1 of a gate drive circuit 2024. Thus, a first plate of the reference capacitor 2016 is connected to the gate drive channel 2024-1, and a second plate of the reference capacitor 2016 is connected to the capacitive sensing electrode 2014.

Each pixel 2012 may also comprise a sense VCI (voltage-controlled impedance) 2020 having a conduction path, and a control terminal (2022; inset A, FIG. 4) for controlling the impedance of the conduction path. The conduction path of the sense VCI 2020 may connect the gate drive channel 2024-1 to an output of the pixel 2012. The control terminal 2022 of the VCI is connected to the capacitive sensing electrode 2014 and to the second plate of the reference capacitor 2016. Thus, in response to a control voltage applied by the gate drive channel 2024-1, the reference capacitor 2016 and the capacitive sensing electrode 2014 act as a capacitive potential divider.

The capacitance of the capacitive sensing electrode 2014 depends on the proximity, to the capacitive sensing electrode 2014, of a conductive surface of an object to be sensed. Thus, when a control voltage is applied to the first plate of the reference capacitor 2016, the relative division of that voltage between that sensing electrode 2014 and the reference capacitor 2016 provides an indication of the proximity of the surface of that conductive object to the capacitive sensing electrode 2014. This division of the control voltage provides an indicator voltage at the connection 2018 between the reference capacitor 2016 and the capacitive sensing electrode 2014. This indicator voltage can be applied to the control terminal 2022 of the sense VCI 2020 to provide an output from the pixel 2012 which indicates proximity of the conductive object.

Pixels may be positioned sufficiently close together so as to be able to resolve contours of the skin such as those associated with epidermal ridges, for example those present in a fingerprint, palmprint or other identifying surface of the body. It will be appreciated in the context of the present disclosure that contours of the skin may comprise ridges, and valleys between those ridges. During touch sensing, the ridges may be relatively closer to a sensing electrode than the "valleys" between those ridges. Accordingly, the capacitance of a sensing electrode adjacent a ridge will be higher than that of a sensing electrode which is adjacent a valley. The description which follows explains how systems can be provided in which sensors of sufficiently high resolution to perform fingerprint and other biometric touch sensing may be provided over larger areas than has previously been possible.

As shown in FIGS. 5 and 6, in addition to the sensor array 2010, such a sensor may also comprise a dielectric shield 2008 (which may provide a carrier material), a gate drive circuit 2024, and a read out circuit 2026. A connector 2025 for connection to a host device may also be included. This may be provided by a multi-channel connector having a plurality of conductive lines. This may be flexible, and may comprise a connector such as a flexi, or flexi-rigid PCB, a ribbon cable or similar, e.g. the connector 2025 may comprise a flex foil. The connector 2025 may carry a connection point 2027 configured to enable connection to a host interface, such as a plug or socket, for connecting the conductive lines in the connector to signal channels of a host device in which the sensor apparatus 2001 is to be included. Alternatively, the connector 2025 may itself carry a host interface, or at least a portion thereof.

The connection point 2027 of the connector 2025 may enable a host interface to be connected to the read-out circuit 2026. A controller (2006; FIG. 6) may be connected to the gate drive circuit 2024 for operating the sensor array, and to the read-out circuit 2026 for obtaining signals indicative of the self-capacitance of pixels of the sensor array 2010.

The dielectric shield 2008 is generally in the form of a sheet of an insulating material which may be transparent and flexible such as a polymer or glass. The dielectric shield 2008 may be flexible, and may be curved. An 'active area' of this shield overlies the sensor array 2010. In some embodiments, the VCIs and other pixel components are carried on a separate substrate, and the shield 2008 overlies these components on their substrate. The shield 2008 may provide the substrate for these components.

The sensor array 2010 may take any one of the variety of forms discussed herein. Different pixel designs may be used, typically however the pixels 2012 comprise at least a capacitive sensing electrode 2014, a reference capacitor 2016, and at least a sense VCI 2020.

The array illustrated in FIG. 5 comprises a plurality of rows of pixels such as those illustrated in FIG. 4. Also shown in FIG. 5 is the gate drive circuit 2024, the read out circuit 2026, and a controller 2006. The controller 2006 is configured to provide one or more control signals, such as a clock signal, e.g. a periodic trigger, to the gate drive circuit 2024, and to the read-out circuit 2026.

The gate drive circuit 2024 comprises a plurality of gate drive channels 2024-1, 2024-2, 2024-3, which it is operable to control separately, e.g. independently. Each such gate drive channel 2024-1, 2024-2, 2024-3 comprises a voltage source arranged to provide a control voltage output. And each channel 2024-1 is connected to a corresponding row of pixels 2012 of the sensor array 2010. In the arrangement shown in FIG. 5 each gate drive channel 2024-1, 2024-2, 2024-3 is connected to the first plate of the reference capacitor 2016 in each pixel 2012 of its row of the sensor array 2010. During each clock cycle, the gate drive circuit 2024 is configured to activate one of the gate drive channels 2024-1, 2024-2, 2024-3 by applying a gate drive pulse to those pixels. Thus, over a series of cycles the channels (and hence the rows) are activated in sequence, and move from one step in this sequence to the next in response to the clock cycle from the controller 2006.

The read-out circuit 2026 comprises a plurality of input channels 2026-1, 2026-2, 2026-3. Each input channel 2026-1, 2026-2, 2026-3 is connected to a corresponding column of pixels 2012 in the sensor array 2010. To provide these connections, the conduction path of the sense VCI 2020 in each pixel 2012 is connected to the input channel 2026-1 for the column.

Each input channel 2026-1, 2026-2, 2026-3 of the read out circuit 2026 may comprise an analogue front end (AFE)

and an analogue-to-digital converter (ADC) for obtaining a digital signal from the column connected to that input channel 2026-1. For example it may integrate the current applied to the input channel during the gate pulse to provide a measure of the current passed through the sense VCI 2020 of the active pixel 2012 in that column. The read out circuit 2026 may convert this signal to digital data using the ADC. Furthermore, the analogue front end performs impedance matching, signal filtering and other signal conditioning and may also provide a virtual reference.

In the sensor array 2010 shown in FIG. 5, the conduction channel of the sense VCI 2020 in each pixel connects the input channel of the read out circuit for that column to the gate drive channel for the pixel's row. In FIG. 5, the gate drive channel for the row thus provides a reference input. Operation of the sense VCI 2020 modulates this reference input to provide the pixel output. This output signal from a pixel indicates the charge stored on the capacitive sensing electrode 2014 in response to that reference input relative to that stored on the reference capacitor.

FIG. 4 includes a grid as a very schematic illustration of the rows and columns of pixels 2012 which make up the array. Typically this will be a rectilinear grid, and typically the rows and columns will be evenly spaced. For example the pixels may be square. It will of course be appreciated that the grid shown in FIG. 4 is not to scale. Typically the sensor array has a pixel spacing of at least 200 dots per inch, dpi (78 dots per cm). The pixel spacing may be at least 300 dpi (118 dots per cm), for example at least 500 dpi (196 dots per cm).

Operation of the sensor array 2010 of FIG. 5 now be described.

On each cycle of operation, the gate drive circuit 2024 and the read out circuit 2026 each receive a clock signal from the controller 2006. The controller 2006 may also control a gate start pulse to be delivered, e.g. to allow scanning to start at the top of the array (e.g. at a first gate-drive channel).

In response to this clock signal, the gate drive circuit operates one of the gate drive channels to apply a control voltage to one of the rows of the array. In each pixel in the row, the control voltage from the gate drive channel is applied to the series connection of the reference capacitor 2016 and the capacitive sensing electrode 2014. The voltage at the connection 2018 between the two provides an indicator voltage indicating the proximity of a conductive surface of an object to be sensed to the capacitive sensing electrode 2014. This indicator voltage may be applied to the control terminal of the sense VCI 2020 to control the impedance of the conduction path of the sense VCI 2020. A current is thus provided through the conduction path of the sense VCI 2020 from the gate drive to the input channel for the pixel's column. This current is determined by the gate drive voltage, and by the impedance of the conduction channel.

In response to the same clock signal, the read-out circuit 2026 senses the pixel output signal at each input channel. This may be done by integrating the current received at each input of the read-out circuit 2026 over the time period of the gate pulse. The signal at each input channel, such as a voltage obtained by integrating the current from the corresponding column of the array, may be digitised (e.g. using an ADC, such as by using at least one of: the current multiplexer 110, the current mirror 120 and/or the dual slope integrator 200 disclosed herein). Thus, for each gate pulse, the read-out circuit 2026 obtains a set of digital signals, each signal corresponding to a column of the active row during that gate pulse. So the set of signals together represent the active row as a whole, and the output from each pixel being indicative of the charge stored on and/or the self-capacitance of the capacitive sensing electrode 2014 in that pixel.

Following this same process, each of the gate-drive channels is activated in sequence. This drives the sense VCI 2020 of each pixel connected to that channel into a conducting state for a selected time (typically the duration of one gate pulse). By activating the rows of the array in sequence the read out circuit, can scan the sensor array row-wise. Other pixel designs, other scan sequences, and other types of sensor array, may be used.

FIG. 6 illustrates another sensor array which may be used in the sensors disclosed herein. For example, the sensor array of FIG. 6 may be used in the sensor array 2010 illustrated in FIG. 4.

FIG. 6 shows a sensor array 2010 comprising a plurality of pixels, and a reference signal supply 2028 for supplying a reference signal to the pixels. This can avoid the need for the gate drive power supply also to provide the current necessary for the read-out signal.

Also shown in FIG. 6 is the gate drive circuit 2024, the read-out circuit 2026, and the controller 2006.

The sensor array 2010 may also benefit from the inclusion of a reset circuit 2032, 2034 in each pixel. This may allow the control terminal 2022 of the pixel to be pre-charged to a selected reset voltage whilst the pixel is inactive (e.g. while another row of the array is being activated by the application of a gate pulse to another, different, row of the array).

In these embodiments the sensor may also comprise a reset voltage provider 2042 for providing a reset voltage to each of the pixels 2012 of the array as described below. The reset voltage provider 2042 may comprise voltage source circuitry, which may be configured to provide a controllable voltage, and may be connected to the controller 2006 to enable the controller 2006 to adjust and fix the reset voltage.

The reset voltage may be selected to tune the sensitivity of the pixel. In particular, the output current of the sense VCI 2020 typically has a characteristic dependence on the indicator voltage at the control terminal 2022 and its switch-on voltage. Thus the reset voltage may be chosen based on the switch-on voltage of the sense VCI 2020. The characteristic may also comprise a linear region in which it may be preferable to operate.

The pixels illustrated in FIG. 6 are similar to those illustrated in FIGS. 3 and 4 in that each comprise a capacitive sensing electrode 2014, and a reference capacitor 2016 connected with a capacitive sensing electrode 2014. The connection between these two capacitances provides an indicator voltage, which can for example be connected to the control terminal 2022 of a sense VCI 2020. In addition, the pixels of the sensor array illustrated in FIG. 6 also comprise a further two VCIs 2034, 2038, and a connection to the reset voltage provider 2042, and a connection to the reference signal supply 2028.

As noted above, the sense VCI 2020 is arranged substantially as described above with reference to FIG. 4, in that its control terminal 2022 is connected to the connection between the reference capacitor 2016 and the capacitive sensing electrode 2014. However, the conduction path of the sense VCI 2020 is connected differently in FIG. 6 than in FIG. 4. In particular, the conduction channel of the select VCI 2038 connects the conduction channel of the sense VCI 2020 to the reference signal supply 2028 which provides a supply voltage $V_{ref}$. Thus, the conduction channel of the sense VCI 2020 is connected in series between the conduction channel of the select VCI 2038 and the input of the read-out circuit for the column. The select VCI 2038 therefore acts as a switch that, when open, connects the sense VCI 2020 between, $V_{ref}$, the reference signal supply 2028 and the input of the read-out circuit and, when closed, disconnects the sense VCI from the reference signal supply 2028. In the interests of clarity, the connection between the conduction channel of the select VCI and $V_{ref}$, the output of the reference signal supply 2028 is shown only in the top row of the array of pixels. The connection reference signal supply 2028 in the lower rows of the array is indicated in the drawing using the label $V_{ref}$.

The select VCI 2038 is therefore operable to inhibit the provision of signal from any inactive pixel to the input of the read-out circuit 2026. This can help to ensure that signal is only received from active pixels (e.g. those in the row to which the gate drive pulse is being applied).

In an embodiment each column of pixels is virtually connected to a ground or reference voltage. As such there may be no voltage differences on each of the columns thereby minimising parasitic capacitance. A reference signal supply may apply a current-drive rather than a voltage-drive e.g. to reduce any effect parasitic capacitance could have on the signal applied by the active pixels on the inputs of the read-out circuit 2026. Alternatively, a voltage-drive may be provided and a sense VCI (optionally in combination with a select VCI) may in turn be operated to provide a current output from the pixel.

The gate drive channel for the pixel row is connected to the first plate of the reference capacitor 2016, and to the control terminal of a select VCI 2038. As in the pixel illustrated in FIGS. 4 and 5, the connection to the reference capacitor 2016 and capacitor sensing electrode 2014 means that the gate drive voltage is divided between the reference capacitor 2016 and the capacitive sensing electrode 2014 to provide the indicator voltage which controls the sense VCI 2020. The connection to the control terminal 2040 of the select VCI 2038 however means that, when the pixel is not active, the conduction path of the sense VCI 2020 is disconnected from the reference signal supply 2028.

A control terminal 2022 of the sense VCI 2020 is connected to the second plate of the reference capacitor 2016. The conduction path of the sense VCI 2020 connects the reference signal supply 2028 to the input of the read-out circuit 2026 for the pixel's column.

A conduction path of the reset VCI 2034 is connected between the second plate of the reference capacitor 2016 and a voltage output of the reset voltage provider, for receiving the reset voltage. The control terminal 2032 of the reset VCI 2034 is connected to a reset signal provider, such as the gate drive channel of another row of the sensor array. This can enable the reset VCI 2034 to discharge the reference capacitor 2016 during activation of another row of the array (e.g. a row of the array which is activated on the gate pulse prior to the pixel's row) or to pre-charge the control terminal 2022 of the sense VCI 2020 to the reset voltage.

Operation of the sensor array of FIG. 6 will now be described.

The gate drive circuit 2024 and the read-out circuit 2026 each receive a clock signal from the controller 2006 (and optionally one or more additional control signals for controlling their operation). In response to this clock signal, the gate drive circuit 2024 activates a first gate drive channel of the gate drive circuit 2024 to provide a gate pulse to a row of the array 2010. A control voltage is thus applied to the control terminal of the select VCI 2038 of the pixels in the first row (the active row during this gate pulse).

The control voltage is also applied to the control terminal of the reset VCI 2034 of the pixels in a second row (inactive during this gate pulse).

In the first row (the active row), the conduction channel of the select VCI 2038 is switched into a conducting state by the control voltage (e.g. that which is provided by the gate pulse). The conduction channel of the select VCI 2038 thus connects the conduction channel of the sense VCI 2020 to the reference signal supply 2028.

The control voltage is also applied to the first plate of the reference capacitor 2016. The relative division of voltage between the sensing electrode 2014 and the reference capacitor 2016 provides an indicator voltage at the connection between the reference capacitor 2016 and the capacitive sensing electrode 2014 as described above with reference to FIGS. 4 and 5. The indicator voltage is applied to the control terminal 2022 of the sense VCI 2020 to control the impedance of the conduction channel of the sense VCI 2020. Thus, the sense VCI 2020 connects the reference signal supply 2028 to the input channel of the read-out circuit 2026 for that column, and presents an impedance between the two which indicates the capacitance of the capacitive sensing electrode 2014. Please note, the reference signal supply may be provided by a constant voltage supply. The select VCI and/or sense VCI may convert the constant voltage reference signal supply into a current output.

A current is thus provided through the conduction path of the sense VCI 2020 from the reference signal supply 2028 to the input channel of the read-out circuit 2026 for the pixel's column. This current is determined by the voltage of the reference signal supply and by the impedance of the conduction channel of the sense VCI.

In response to the same clock signal from the controller 2006, the read-out circuit 2026 senses the pixel output signal at each input channel (e.g. by integrating the current provided to each input channel), and digitises this signal. The integration time of the read-out circuit 2026 may match the duration of the gate pulse.

Thus, in each clock cycle, the read-out 2026 circuit obtains a set of digital signals, each signal corresponding to the signals sensed from each column of the active row during the gate pulse. The output from each pixel 2012 in the row (each channel during that gate pulse) being indicative of the charge stored on the capacitive sensing electrode in that pixel.

In the second (inactive) row the control voltage is applied to the control terminal 2032 of the reset VCI 2034. This causes the reset VCI 2034 of the pixels in the inactive row to connect the second plate of their reference capacitors 2016 to a reset voltage provided by the reset voltage provider. This may discharge (e.g. at least partially remove) charge accumulated on the pixels of the inactive row, or it may charge them to the reset voltage, before they are next activated in a subsequent gate pulse. This reset voltage may be selected to tune the sensitivity of the pixels.

At the boundaries of the pixel array, where an N−1 gate line is not available, a dummy signal may be used to provide the control signal to the reset VCI. The gate drive circuit 2024 may provide the dummy signal. This may be provided by a gate drive channel which is only connected to the rest VCIs of a row at the boundary of the array, but not to any sense or select VCIs.

As illustrated in FIG. 3, the reset VCI 2034 of the pixels may be connected to the gate drive circuit so that each row is discharged in this way by the gate pulse which activates the immediately preceding row, which may be an adjacent row of the array.

It is to be appreciated in the context of the present disclosure that reference to voltage-controlled impedances and/or to transistors are not to be considered limiting. Such components may have a conductive path having a conduction dependent on a voltage at a control terminal of that component. For example, the voltage-controlled impedances may comprise transistors such as field effect transistors (e.g. thin film transistors), or other components may be used. For transistors, the control terminal may be a gate region, with the conductive path being between drain and source. The conductive path may be selectively opened based on the voltage at the drain region.

It will be appreciated from the discussion above that the examples shown in the figures are merely exemplary, and include features which may be generalised, removed or replaced as described herein and as set out in the claims. With reference to the drawings in general, it will be appreciated that schematic functional block diagrams are used to indicate functionality of systems and apparatus described herein. In addition, the processing functionality may also be provided by devices which are supported by an electronic device. It will be appreciated however that the functionality need not be divided in this way, and should not be taken to imply any particular structure of hardware other than that described and claimed below. The function of one or more of the elements shown in the drawings may be further subdivided, and/or distributed throughout apparatus of the disclosure. In some examples the function of one or more elements shown in the drawings may be integrated into a single functional unit.

As will be appreciated by the skilled reader in the context of the present disclosure, each of the examples described herein may be implemented in a variety of different ways. Any feature of any aspects of the disclosure may be combined with any of the other aspects of the disclosure. For example method aspects may be combined with apparatus aspects, and features described with reference to the operation of particular elements of apparatus may be provided in methods which do not use those particular types of apparatus. In addition, each of the features of each of the examples is intended to be separable from the features which it is described in combination with, unless it is expressly stated that some other feature is essential to its operation. Each of these separable features may of course be combined with any of the other features of the examples in which it is described, or with any of the other features or combination of features of any of the other examples described herein. Furthermore, equivalents and modifications not described above may also be employed without departing from the invention.

Certain features of the methods described herein may be implemented in hardware, and one or more functions of the apparatus may be implemented in method steps. It will also be appreciated in the context of the present disclosure that the methods described herein need not be performed in the order in which they are described, nor necessarily in the order in which they are depicted in the drawings. Accordingly, aspects of the disclosure which are described with reference to products or apparatus are also intended to be implemented as methods and vice versa. The methods described herein may be implemented in computer programs, or in hardware or in any combination thereof. Computer programs include software, middleware, firmware, and any combination thereof. Such programs may be provided as signals or network messages and may be recorded on computer readable media such as tangible computer readable media which may store the computer programs in non-transitory form. Hardware includes computers, handheld devices, programmable processors, general purpose processors, application specific integrated circuits (ASICs), field programmable gate arrays (FPGAs), and arrays of logic gates.

Other examples and variations of the disclosure will be apparent to the skilled addressee in the context of the present disclosure.

The invention claimed is:

1. A capacitive biometric skin contact sensor configured to resolve the contours of skin in contact with the sensor, wherein the sensor comprises:
   an array of sensor pixels, wherein each sensor pixel comprises a thin film transistor and a capacitive sensing electrode connected to the thin film transistor;
   a plurality of gate drive channels, wherein each gate drive channel is arranged to provide a gate drive signal to one or more of the sensor pixels;
   a plurality of read-out channels, wherein each read-out channel is arranged to receive a read-out current from one or more of the sensor pixels, each read-out current being indicative of a proximity to a respective capacitive sensing electrode of a conductive object to be sensed;
   a current multiplexer connected to a first plurality of the read-out channels to receive read-out currents therefrom, wherein the current multiplexer is configured to select one or more read-out currents from said first plurality of read-out channels; and
   analog to digital converter comprising a dual slope integrator arranged to receive, as its input, either an output current based on the one or more read-out currents selected by the current multiplexer or a reference voltage;
   wherein the biometric sensor is configured to:
      apply the output current as the input to the dual slope integrator for a charging time period to charge a capacitor of the dual slope integrator;
      apply the reference voltage as the input to the dual slope integrator for a discharging time period, wherein the discharging time period comprises the amount of time it takes for the capacitor to discharge; and
      determine the proximity to the one or more respective capacitive sensing electrodes of the conductive body based on an indication of the discharging time period;
   wherein the sensor is configured to control: (i) a sensor resolution by controlling the number of read-out currents selected by the multiplexer, and (ii) a sensor sensitivity by controlling the charging time period for the dual slope integrator.

2. The biometric sensor of claim 1, wherein the biometric sensor is configured to increase the charging time period to increase the sensitivity of the sensor.

3. The biometric sensor of claim 1, wherein the biometric sensor is configured to:
   control the number of read-out currents selected by the multiplexer based on the charging time period; and/or
   control the charging time period based on the number of read-out currents selected by the multiplexer.

4. A capacitive biometric skin contact sensor configured to resolve the contours of skin in contact with the sensor, wherein the sensor comprises:
   an array of sensor pixels, wherein each sensor pixel comprises a thin film transistor and a capacitive sensing electrode connected to the thin film transistor;

a plurality of gate drive channels, wherein each gate drive channel is arranged to provide a gate drive signal to one or more of the sensor pixels;
a plurality of read-out channels, wherein each read-out channel is arranged to receive a read-out current from one or more of the sensor pixels, each read-out current being indicative of a proximity to a respective capacitive sensing electrode of a conductive object to be sensed;
a current mirror assembly connected to receive an input current based on one or more read-out currents and to provide a selected gain to the input current; and
an analog to digital converter comprising a dual slope integrator arranged to receive, as its input, either an output current or a reference voltage, wherein said output current is based on the current from the current mirror assembly;
wherein the biometric sensor is configured to:
apply the output current as the input to the dual slope integrator for a charging time period to charge a capacitor of the dual slope integrator;
apply the reference voltage as the input to the dual slope integrator for a discharging time period, wherein the discharging time period comprises the amount of time it takes for the capacitor to discharge; and
determine the proximity to the one or more respective capacitive sensing electrodes of the conductive body based on an indication of the discharging time period;
wherein the sensor is configured to control a sensor sensitivity by controlling the selected gain provided by the current mirror assembly and the charging time period for the dual slope integrator.

5. The biometric sensor of claim 4, wherein the biometric sensor is configured to:
control the selected gain to the input current based on the charging time period; and/or
control the charging time period based on the selected gain to the input current.

6. The biometric sensor of claim 1, wherein the sensor comprises:
a current mirror assembly connected to the multiplexer to receive an input current therefrom and to provide a selected gain to the input current to provide the output current;
wherein the sensor is configured to control the selected gain to the input current.

7. The biometric sensor of claim 6, wherein at least one of:
the sensor is configured to control at least one of: (i) the number of read-out currents selected by the multiplexer, and (ii) the selected gain to the input current, based on the charging time period;
the sensor is configured to control at least one of: (i) the number of read-out currents selected by the multiplexer, and (ii) the charging time period, based on the selected gain to the input current; and
the sensor is configured to control at least one of: (i) the selected gain to the input current, and (ii) the charging time period, based on the number of read-out currents selected by the multiplexer.

8. The biometric sensor of claim 6, wherein the sensor is configured to control at least one of: (i) the number of read-out currents selected by the multiplexer, and (ii) the selected gain to the input current, to increase the output current when the charging time period is decreased.

9. The biometric sensor of claim 6, wherein the sensor is configured to control a sensor sensitivity by controlling the selected gain to the input current.

10. The biometric sensor of claim 1, wherein the dual slope integrator comprises an integrator and a comparator, wherein the capacitor is part of the integrator;
wherein the positive terminal of the comparator is connected to a reference voltage and wherein the negative terminal of the comparator is connected to the output from the integrator; and
wherein the output from the comparator is connected to a controller configured to determine the discharging time period.

11. The biometric sensor of claim 1, wherein each sensor pixel comprises a reference capacitor, and wherein for each sensor pixel, the reference capacitor and the capacitive sensing electrode are connected to a gate region of the thin film transistor.

12. A method of operating a capacitive biometric skin contact sensor configured to resolve the contours of skin in contact with the sensor, wherein the sensor comprises:
an array of sensor pixels, wherein each sensor pixel comprises a thin film transistor and a capacitive sensing electrode connected to the thin film transistor;
a plurality of gate drive channels, wherein each gate drive channel is arranged to provide a gate drive signal to one or more of the sensor pixels;
a plurality of read-out channels, wherein each read-out channel is arranged to receive a read-out current from one or more of the sensor pixels, each read-out current being indicative of a proximity to a respective capacitive sensing electrode of a conductive object to be sensed;
a current multiplexer connected to a first plurality of the read-out channels to receive read-out currents therefrom, wherein the current multiplexer is configured to select one or more read-out currents from said first plurality of read-out channels; and
an analog to digital converter comprising a dual slope integrator arranged to receive, as its input, either an output current based on the one or more read-out currents selected by the current multiplexer or a reference voltage;
wherein the method comprises:
applying the output current as the input to the dual slope integrator for a charging time period to charge a capacitor of the dual slope integrator;
applying the reference voltage as the input to the dual slope integrator for a discharging time period, wherein the discharging time period comprises the amount of time it takes for the capacitor to discharge;
determining the proximity to the one or more respective capacitive sensing electrodes of the conductive body based on an indication of the discharging time period; and
controlling: (i) a sensor resolution by controlling the number of read-out currents selected by the multiplexer, and (ii) a sensor sensitivity by controlling the charging time period for the dual slope integrator.

13. The method of claim 12, wherein the method comprises increasing the charging time period to increase the sensitivity of the sensor.

14. The method of claim 12, further comprising:
controlling the number of read-out currents selected by the multiplexer based on the charging time period; and/or controlling the charging time period based on the number of read-out currents selected by the multiplexer.

15. The method of claim 12, wherein the sensor comprises a current mirror assembly configured to receive an input current indicative of the one or more read-out currents and to provide a selected gain to the input current to provide the output current, and wherein the method comprises:
controlling the selected gain to the input current based on the charging time period; and/or
controlling the charging time period based on the selected gain to the input current.

16. The method of claim 12, wherein the sensor comprises: a current mirror assembly connected to the multiplexer to receive an input current therefrom and to provide a selected gain to the input current to provide the output current, and wherein the method comprises:
controlling the sensitivity of the sensor by controlling the selected gain to the input current.

17. A computer program product comprising computer program instructions configured to program a controller to perform the method of claim 12.

18. The biometric sensor of claim 1, wherein the sensor is configured to increase sensor resolution by reducing the number of read-out currents simultaneously selected by the multiplexer.

19. The biometric sensor of claim 4, wherein the sensor is configured to increase sensor sensitivity by increasing the selected gain.

20. The biometric sensor of claim 4, wherein the sensor is configured to increase sensor sensitivity by increasing the charging time period.

* * * * *